US012355361B2

(12) United States Patent
Katsube et al.

(10) Patent No.: US 12,355,361 B2
(45) Date of Patent: Jul. 8, 2025

(54) POWER CONVERSION DEVICE

(71) Applicant: Mitsubishi Electric Corporation, Tokyo (JP)

(72) Inventors: Hiroki Katsube, Tokyo (JP); Masakazu Tani, Tokyo (JP); Shota Yamabe, Tokyo (JP); Takuya Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 200 days.

(21) Appl. No.: 18/145,456

(22) Filed: Dec. 22, 2022

(65) Prior Publication Data

US 2023/0396183 A1 Dec. 7, 2023

(30) Foreign Application Priority Data

Jun. 2, 2022 (JP) ................. 2022-090024

(51) Int. Cl.
| H05K 5/02 | (2006.01) |
| H02G 5/02 | (2006.01) |
| H02M 7/00 | (2006.01) |

(52) U.S. Cl.
CPC .............. *H02M 7/003* (2013.01); *H02G 5/02* (2013.01); *H05K 5/0247* (2013.01)

(58) Field of Classification Search
CPC ... H05K 5/0017; H05K 5/0217; H05K 5/0247
USPC ........................................................ 361/807
See application file for complete search history.

(56) References Cited

U.S. PATENT DOCUMENTS

| 2010/0321889 | A1* | 12/2010 | Yoshino | ............ H05K 7/20927 |
| | | | | 361/702 |
| 2014/0118909 | A1* | 5/2014 | Matsuno | ............... H02M 7/003 |
| | | | | 361/679.01 |
| 2016/0128216 | A1* | 5/2016 | Harada | ............ H05K 7/14329 |
| | | | | 361/728 |
| 2021/0021203 | A1 | 1/2021 | Kojima et al. | |

FOREIGN PATENT DOCUMENTS

| CN | 104795986 A | * | 7/2015 | ............ H02M 1/12 |
| JP | 6932225 B1 | * | 9/2021 | ............ H01G 2/08 |
| JP | 7031452 B2 | | 3/2022 | |

* cited by examiner

*Primary Examiner* — Hung S. Bui
(74) *Attorney, Agent, or Firm* — Sughrue Mion, PLLC

(57) ABSTRACT

This power conversion device includes: a power module unit; and a capacitor module including a capacitor element, and a capacitor busbar. The capacitor busbar has a flat-plate portion, a plurality of power terminal connection portions, a power supply connection portion, and a plurality of element connection portions. An element-connection-portion position range which is a position range in a first direction between two element connection portions located at both ends, and a power-terminal-connection-portion position range which is a position range in the first direction between two power terminal connection portions located at both ends, are within a position range in the first direction where the flat-plate portion is located. A length of the element-connection-portion position range and a length of the power-terminal-connection-portion position range are equivalent to each other. A center position of the element-connection-portion position range and a center position of the power-terminal-connection-portion position range are equivalent to each other.

22 Claims, 15 Drawing Sheets

POWER CONVERSION DEVICE

BACKGROUND

The present disclosure relates to a power conversion device.

In an electric vehicle using a motor as a drive source as in an electric automobile or a hybrid vehicle, a plurality of power conversion devices are mounted. Examples of power conversion devices include a charger for converting commercial AC power to DC power and charging a high-voltage battery, a DC/DC converter for converting DC power of a high-voltage battery to voltage (e.g., 12 V) for an auxiliary-device battery, and an inverter for converting DC power from a battery to AC power for a motor.

As an example of such power conversion devices, disclosed is a power conversion device including a power module having a semiconductor element for performing power conversion, a cooler for cooling the power module, and a capacitor having a capacitor element for smoothing DC voltage supplied from an external DC power supply (see, for example, Patent Document 1). Since ripple current flows through the capacitor element, the capacitor element consumes power and generates heat. In addition, the capacitor element is connected to the power module via a busbar, and therefore, when the temperature of the power module increases, heat transfers from the power module to the capacitor element via the busbar, and the temperature of the capacitor element is also increased by the transferred heat. In particular, in a high-output-density power conversion device, heat transfer to the busbar connecting the power module and the capacitor element, and heat generation due to Joule heat of the busbar, are increased. When the temperature of the busbar is significantly increased, heat transfers to the capacitor element and the temperature of the capacitor element increases. Temperature increase in the capacitor element shortens the life of the capacitor element, thus posing a problem of taking measures for temperature increase in the capacitor element.

In the structure disclosed in Patent Document 1, the capacitor includes a capacitor element, sealing resin sealing the capacitor element, and a pair of busbars connected to the capacitor element. Each busbar has an exposed portion exposed from the sealing resin, and each exposed portion has a plate-shaped portion, a power supply terminal extending from the plate-shaped portion and electrically connected to a DC power supply, and component connection terminals extending from the plate-shaped portion and electrically connected to other electronic components such as a power module. Each plate-shaped portion has a specific portion having a smaller thickness than the surrounding thickness, in an area on the power supply terminal side relative to the component connection terminals. The specific portion is a recess, a through hole penetrating in a thickness direction (Z) of each plate-shaped portion, or a slit portion formed in a slit shape communicating with an edge of the plate-shaped portion. The direction in which the exposed portion and the capacitor element are arranged is defined as a transverse direction (X), and a long-side direction of the sealing resin as seen from the transverse direction is defined as a longitudinal direction (Y). The power supply terminal is formed at one end in the longitudinal direction of the exposed portion, and the component connection terminals are formed at an end of the exposed portion on the side opposite to the side where the power supply terminal is formed, in the longitudinal direction. The specific portion is formed between the power supply terminal and a connection part between the busbar and the capacitor element, in the transverse direction.

Patent Document 1: Japanese Patent No. 7031452

In Patent Document 1, the busbar connects the capacitor element, the DC power supply, and the power module, and is formed such that a DC path between the DC power supply and the power module is exposed to outside of the sealing resin. In the exposed portion of the busbar, the specific portion having a smaller thickness than the surrounding thickness is formed. Therefore, the electric resistance of the exposed portion becomes higher around the specific portion. In addition, the specific portion is formed in an area on the power supply terminal side relative to the component connection terminals at the exposed portion, and is located between the power supply terminal and the connection part between the busbar and the capacitor element. Therefore, the electric resistance becomes higher in the area on the power supply terminal side relative to the component connection terminals at the plate-shaped portion.

With this structure, a DC component of DC current flowing into the power supply terminal is readily guided to the component connection terminal side. Thus, the DC component of the DC current flowing from the power supply terminal into the plate-shaped portion is readily prevented from flowing toward the busbar side connected to the capacitor element in the sealing resin. In addition, when large current flows through a DC path portion from the power supply terminal to the component connection terminals, heat due to the current is readily dissipated efficiently. However, the exposed portion of the busbar serves as a current path between the DC power supply and the power module, and a current path between the DC power supply and the capacitor element, and also serves as a current path between the capacitor element and the power module. Therefore, at the specific portion, the electric resistance of the current path between the capacitor element and the power module becomes higher, thus causing a problem of increasing the wiring inductance between the capacitor element and the power module. In addition, if the wiring inductance between the capacitor element and the power module increases, the temperature of the busbar increases. When the temperature of the busbar is significantly increased, heat transfers to the capacitor element and the temperature of the capacitor element increases.

SUMMARY

Accordingly, an object of the present disclosure is to provide a power conversion device in which increase in the wiring inductance between a capacitor element and a power module unit is suppressed and heat dissipation of a busbar connecting the capacitor element and the power module unit is improved.

A power conversion device according to the present disclosure includes: a power module unit including a plurality of semiconductor elements arranged in a first direction, a power body portion storing the plurality of semiconductor elements separately in a plurality of portions or collectively in one portion, and a plurality of power terminals respectively connected to the plurality of semiconductor elements and protruding from the power body portion toward one side in a second direction perpendicular to the first direction, the plurality of power terminals being arranged in the first direction; and a capacitor module including a capacitor element, a capacitor case storing the capacitor element with capacitor sealing resin interposed, and a capacitor busbar connected to the capacitor element. The capacitor busbar has a flat-plate portion formed in a plate shape of which a width in the first direction is greater than a width in the second direction, the flat-plate portion being exposed to outside from the capacitor sealing resin, a plurality of power terminal connection portions extending toward another side in the second direction from the flat-plate portion and arranged in the first direction, the plurality of power terminal connection portions being respectively connected to the plurality of power terminals, a power supply connection portion connected to the flat-plate portion and connected to a DC power supply, and a plurality of element connection portions connected to the flat-plate portion and located on the one side in the second direction relative to the flat-plate portion, the plurality of element connection portions being arranged in the first direction and connected to the capacitor element. An element-connection-portion position range which is a position range in the first direction between two element connection portions located at both ends in the first direction among the plurality of element connection portions, and a power-terminal-connection-portion position range which is a position range in the first direction between two power terminal connection portions located at both ends in the first direction among the plurality of power terminal connection portions, are within a position range in the first direction where the flat-plate portion is located. A length of the element-connection-portion position range and a length of the power-terminal-connection-portion position range are equivalent to each other. A center position of the element-connection-portion position range and a center position of the power-terminal-connection-portion position range are equivalent to each other.

The power conversion device according to the present disclosure includes the power module unit and the capacitor module. The capacitor busbar has: the flat-plate portion formed in the plate shape of which the width in the first direction is greater than the width in the second direction, the flat-plate portion being exposed to outside from the capacitor sealing resin; the plurality of power terminal connection portions extending toward the other side in the second direction from the flat-plate portion and arranged in the first direction, the plurality of power terminal connection portions being respectively connected to the plurality of power terminals; the power supply connection portion connected to the flat-plate portion and connected to the DC power supply; and the plurality of element connection portions connected to the flat-plate portion and located on the one side in the second direction relative to the flat-plate portion, the plurality of element connection portions being arranged in the first direction and connected to the capacitor element. The element-connection-portion position range which is the position range in the first direction between two element connection portions located at both ends in the first direction among the plurality of element connection portions, and the power-terminal-connection-portion position range which is the position range in the first direction between two power terminal connection portions located at both ends in the first direction among the plurality of power terminal connection portions, are within the position range in the first direction where the flat-plate portion is located. The length of the element-connection-portion position range and the length of the power-terminal-connection-portion position range are equivalent to each other. The center position of the element-connection-portion position range and the center position of the power-terminal-connection-portion position range are equivalent to each other. Thus, the capacitor busbar has a sufficient width in the first direction in the current path in the second direction between the plurality of element connection portions and the plurality of power terminal connection portions, so that increase in the electric resistance of the current path is suppressed, whereby increase in the wiring inductance between the capacitor element and the power module unit can be suppressed. In addition, the flat-plate portion serving as the current path between the capacitor element and the power module unit, and the current path between the DC power supply and the power module unit, is exposed to outside from the capacitor sealing resin. Thus, heat dissipation of the capacitor busbar can be improved.

DETAILED DESCRIPTION OF THE EMBODIMENTS

Figure 1:
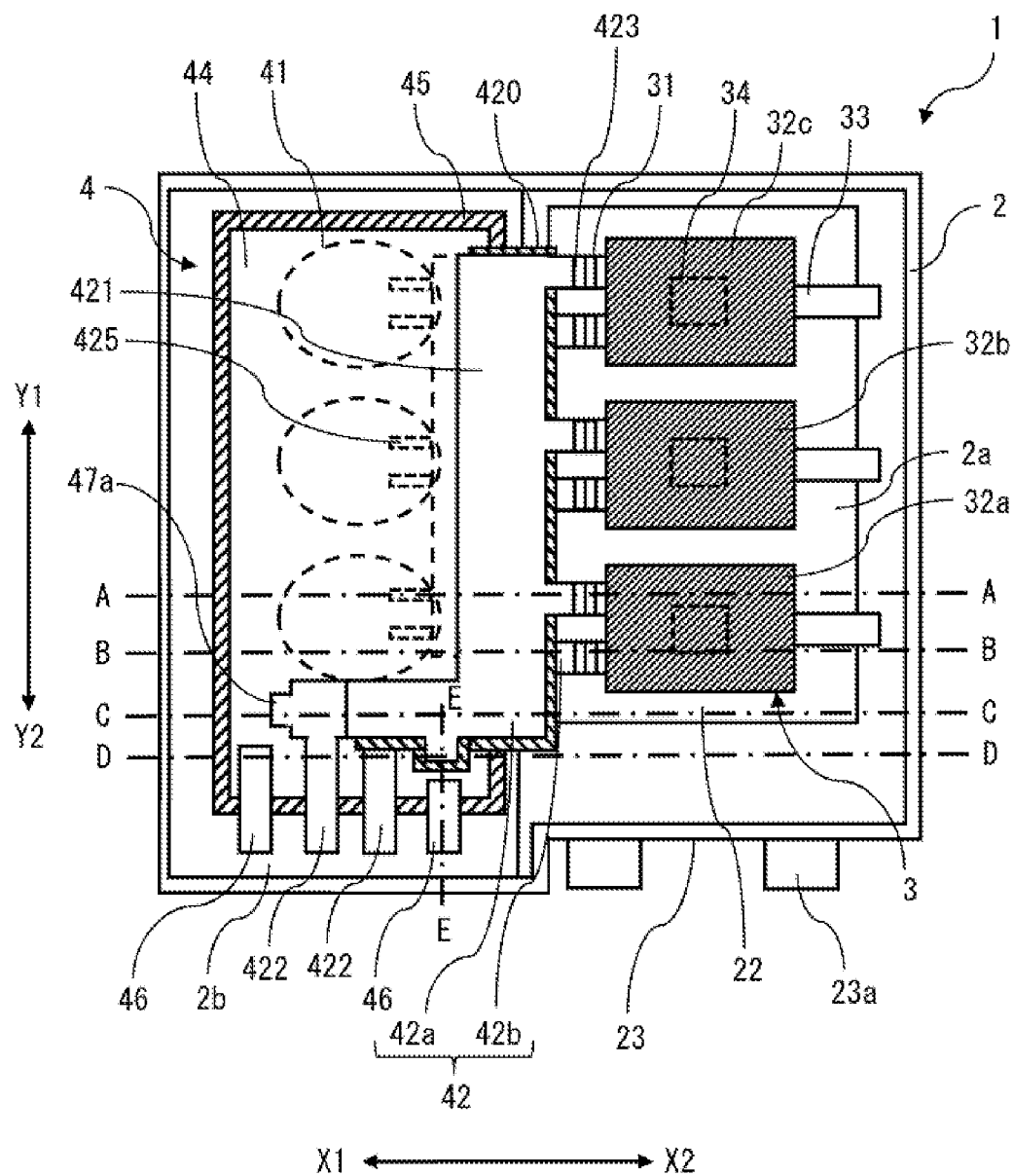
FIG. 1 is a plan view schematically showing a power conversion device according to the first embodiment of the present disclosure.

Hereinafter, a power conversion device according to embodiments of the present disclosure will be described with reference to the drawings. In the drawings, the same or corresponding members and parts are denoted by the same reference characters, to give description.

First Embodiment

Figure 2:
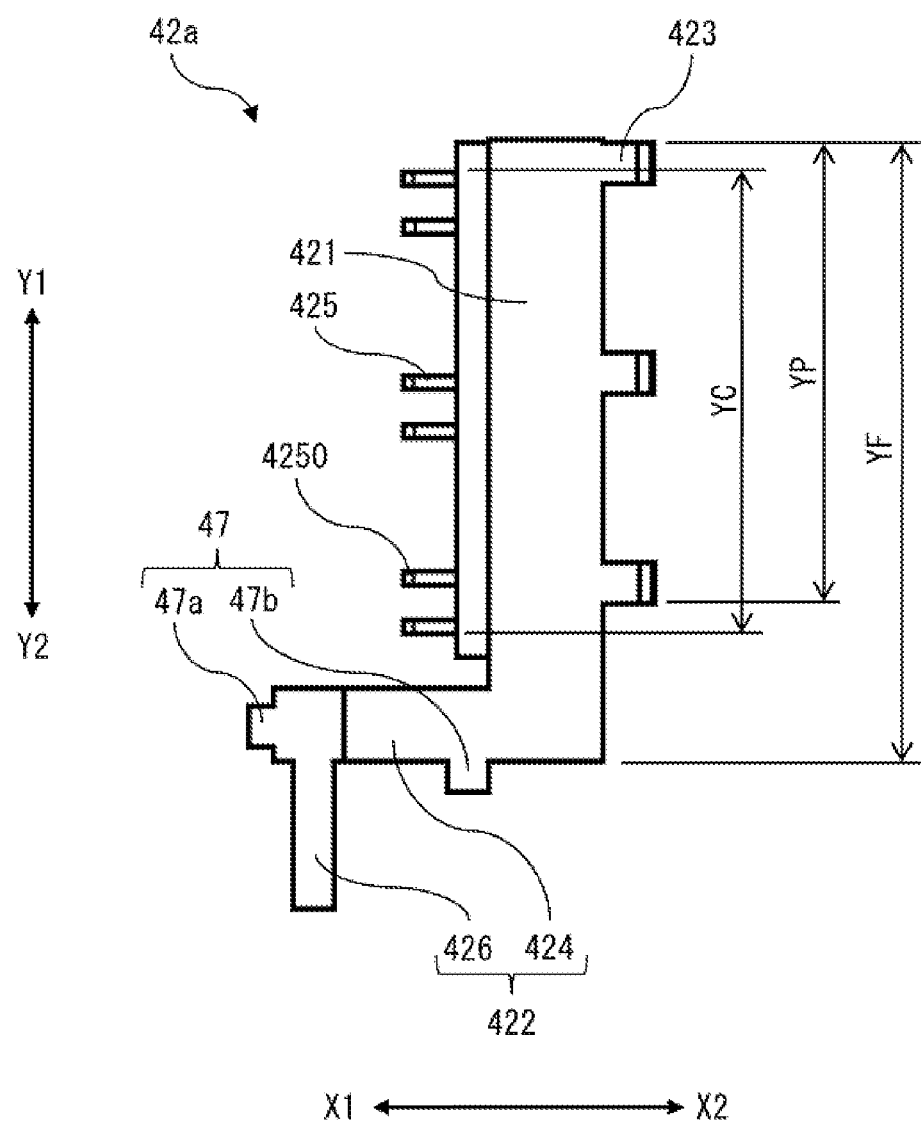
FIG. 2 is a plan view of a positive busbar of the power conversion device according to the first embodiment.
Figure 3:
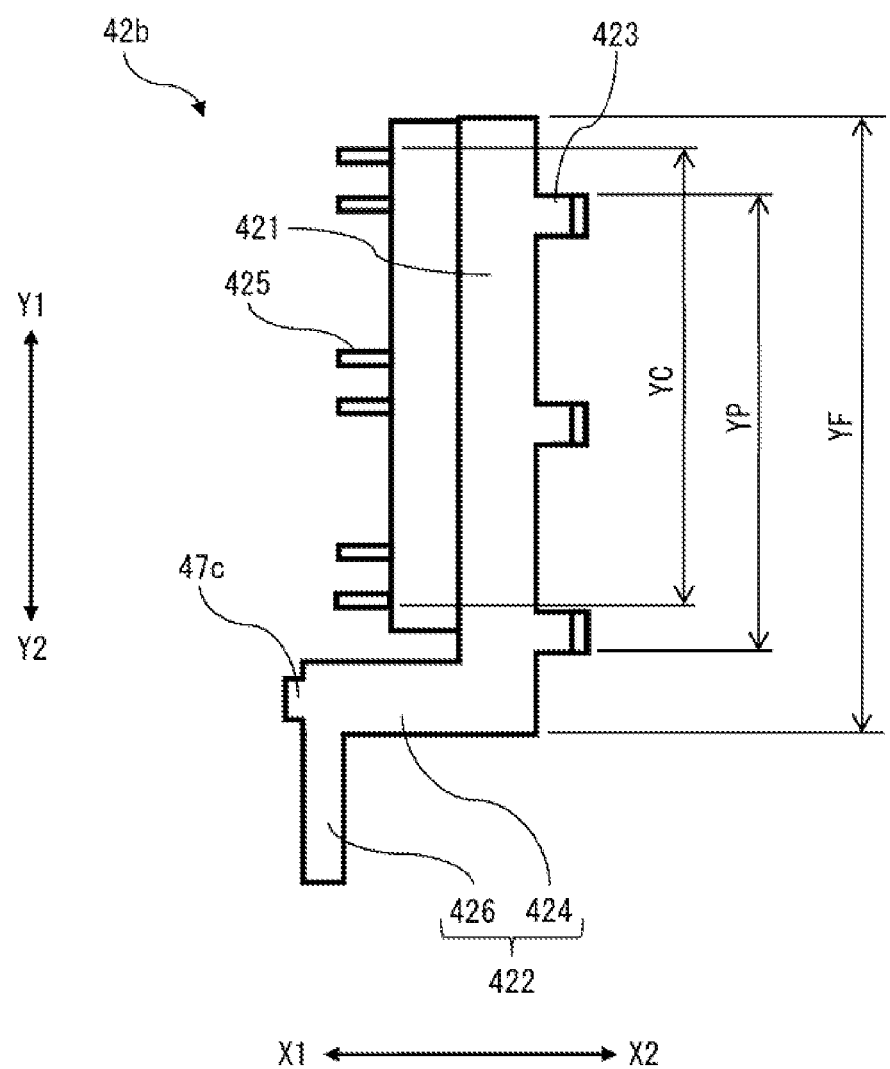
FIG. 3 is a plan view of a negative busbar of the power conversion device according to the first embodiment.
Figure 4:
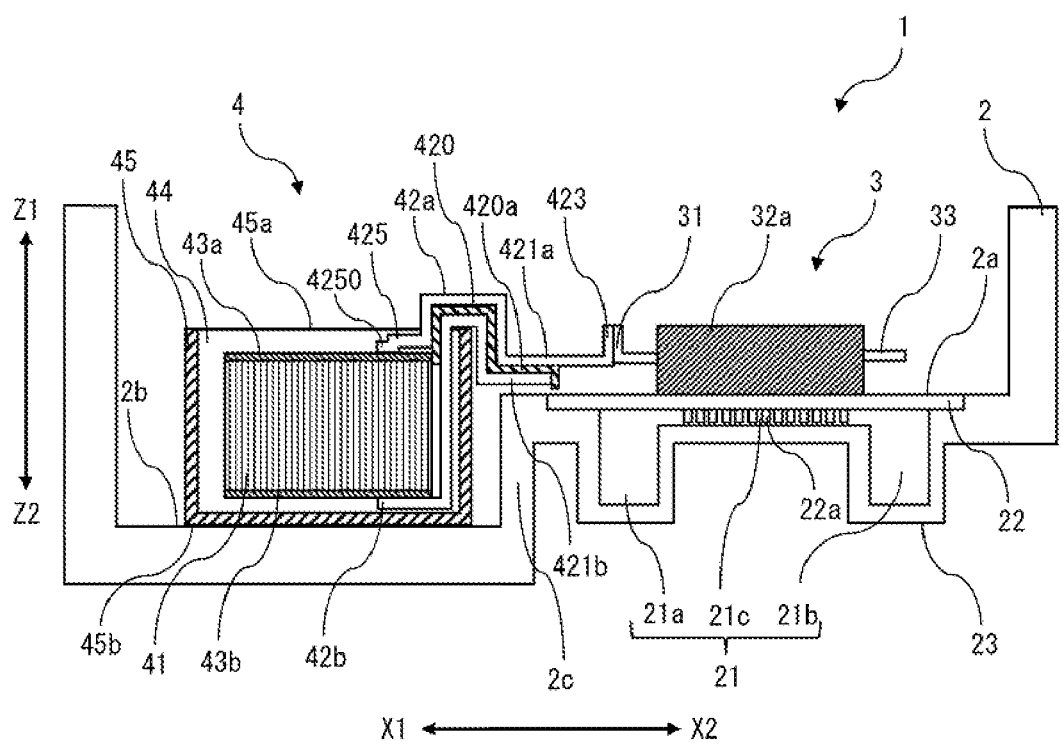
FIG. 4 is a sectional view of the power conversion device taken at an A-A cross-section position in FIG. 1.
Figure 5:
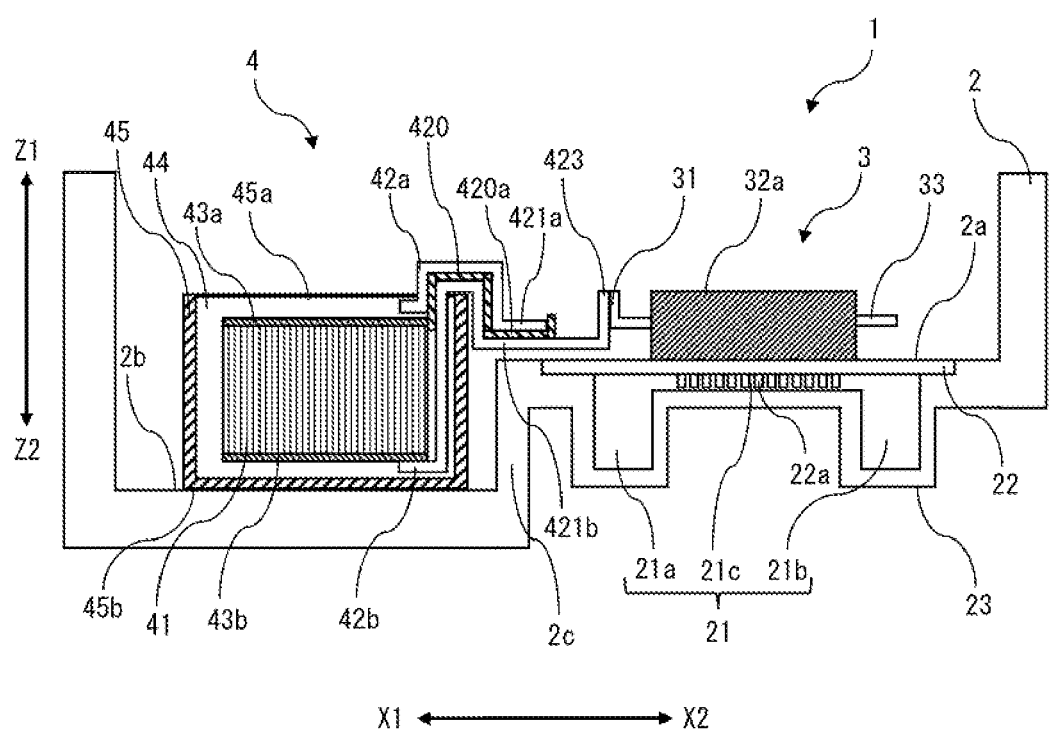
FIG. 5 is a sectional view of the power conversion device taken at a B-B cross-section position in FIG. 1.
Figure 6:
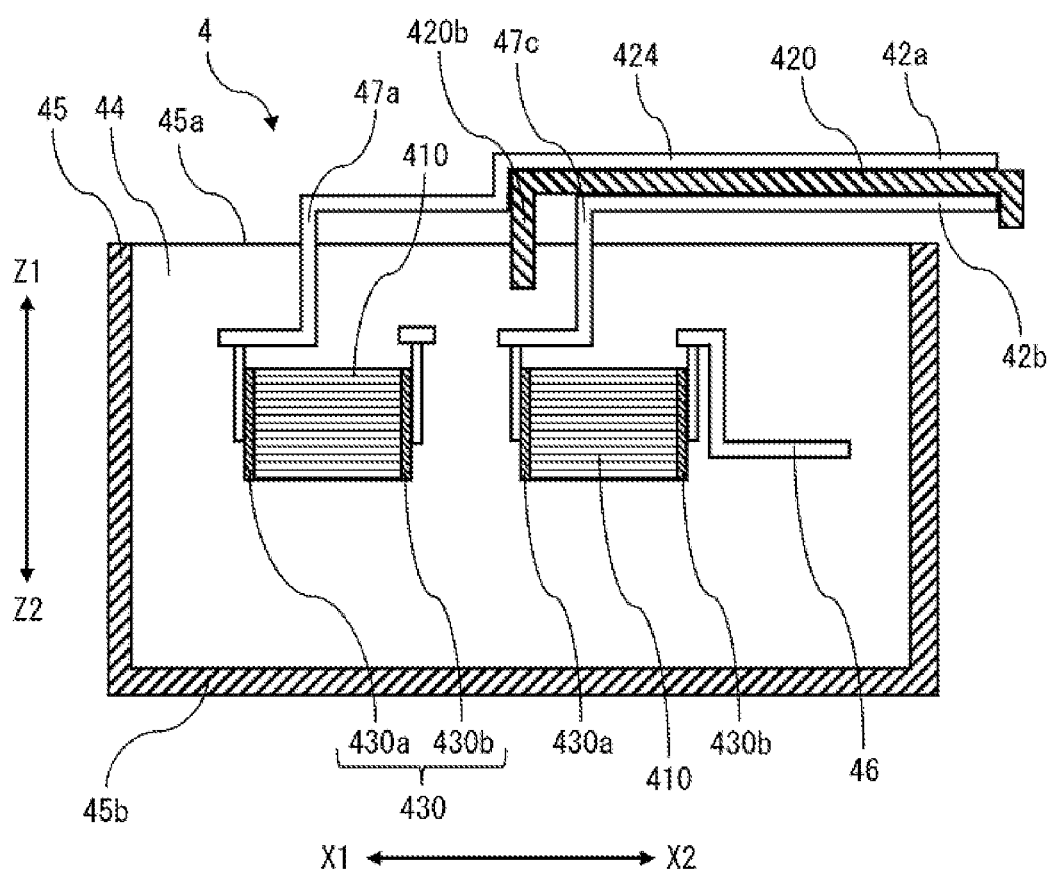
FIG. 6 is a sectional view of the power conversion device taken at a C-C cross-section position in FIG. 1.
Figure 7:
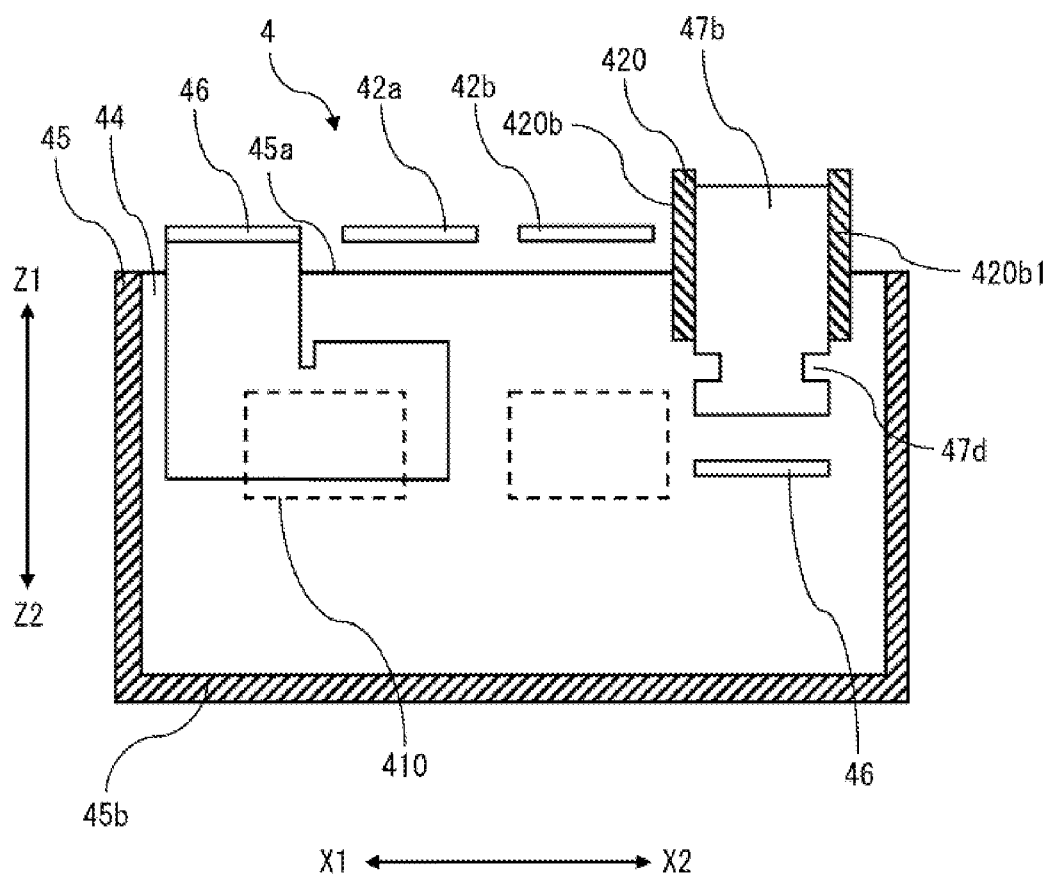
FIG. 7 is a sectional view of the power conversion device taken at a D-D cross-section position in FIG. 1.
Figure 8:
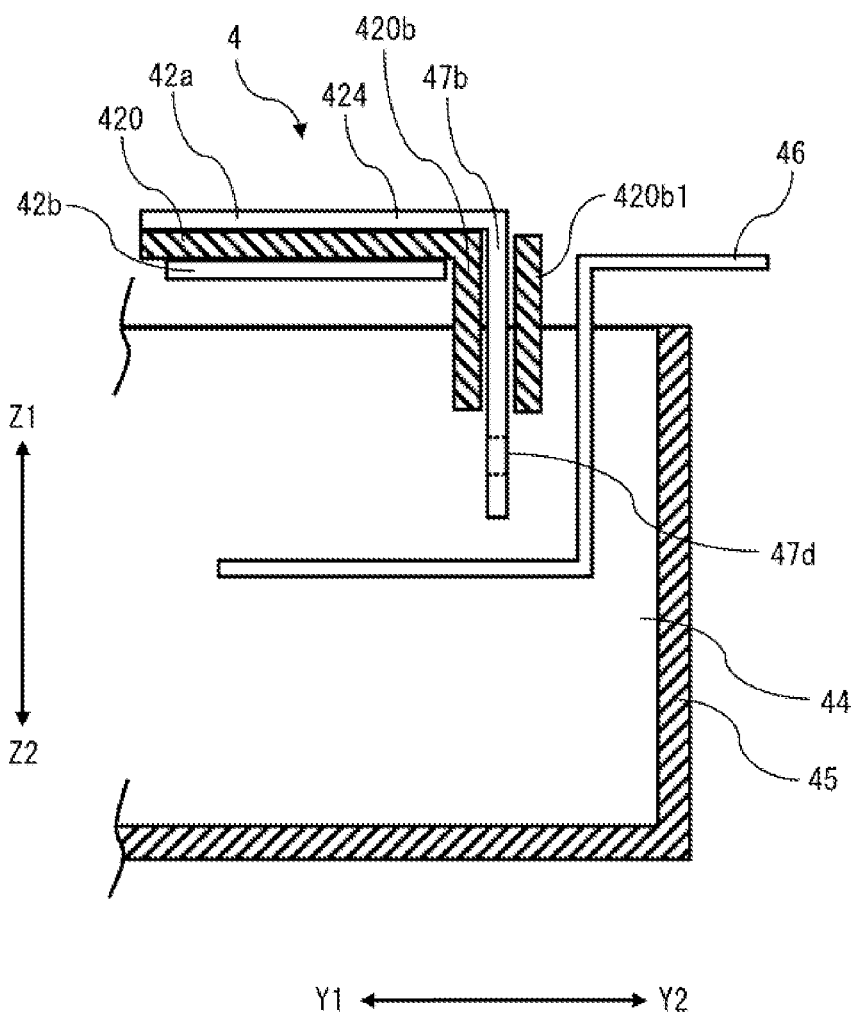
FIG. 8 is a sectional view showing a major part of the power conversion device according to the first embodiment.
Figure 9:
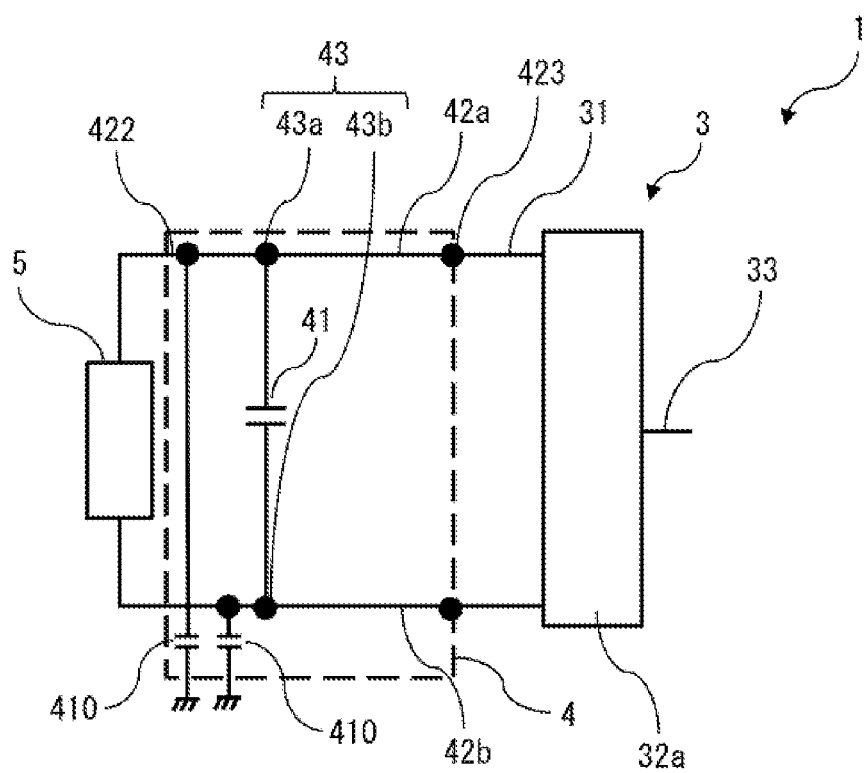
FIG. 9 schematically shows a circuit of the power conversion device according to the first embodiment.

FIG. 1 is a plan view schematically showing a power conversion device 1 according to the first embodiment of the present disclosure. FIG. 2 is a plan view of a positive busbar 42a of the power conversion device 1. FIG. 3 is a plan view of a negative busbar 42b of the power conversion device 1. FIG. 4 is a sectional view of the power conversion device 1 taken at an A-A cross-section position in FIG. 1. FIG. 5 is a sectional view of the power conversion device 1 taken at a B-B cross-section position in FIG. 1. FIG. 6 is a sectional view of the power conversion device 1 taken at a C-C cross-section position in FIG. 1 and shows a capacitor module 4 part. FIG. 7 is a sectional view of the power conversion device 1 taken at a D-D cross-section position in FIG. 1 and shows a capacitor module 4 part. FIG. 8 is a sectional view showing a major part of the power conversion device 1 and shows a support portion 47b and a surrounding part taken at an E-E cross-section position in FIG. 1. FIG. 9 schematically shows a circuit of the power conversion device 1. The power conversion device 1 is a device for converting input current from DC to AC or from AC to DC, or converting input voltage to different voltage.

As shown in FIG. 1, the power conversion device 1 includes a power module unit 3, a capacitor module 4, and a housing 2. The housing 2 stores the power module unit 3 and the capacitor module 4. As shown in FIG. 9, the power conversion device 1 in the present embodiment is a device in which DC power inputted from a power supply connection portion 422 of the capacitor module 4 connected to a DC power supply 5 and smoothed by the capacitor module 4 is subjected to power conversion by the power module unit 3 and then the resultant power is outputted from an output terminal 33. In the present embodiment, the power conversion device 1 that outputs three-phase AC power is shown, and as shown in FIG. 1, the power module unit 3 is composed of three power body portions 32a, 32b, 32c corresponding to the respective phases. In FIG. 9, only one power body portion 32a is shown, but the other two power body portions 32b, 32c also have the same configuration. The DC power supply 5 which is provided outside the power conversion device 1 and connected to the power supply connection portion 422, is not shown in FIG. 1. The power conversion device 1 is not limited to this configuration, and may be a device for converting input current from AC to DC.

<Power Module Unit 3>

As shown in FIG. 1, the power module unit 3 includes a plurality of semiconductor elements 34 arranged in a first direction, a power body portion storing the plurality of semiconductor elements 34 separately in a plurality of portions or collectively in one portion, and a plurality of power terminals 31 respectively connected to the plurality of semiconductor elements 34 and protruding from the power body portion toward one side in a second direction perpendicular to the first direction, the plurality of power terminals 31 being arranged in the first direction. In the drawings, the first direction is defined as a Y direction, a side toward Y1 is defined as one side in the first direction, and a side toward Y2 is defined as another side in the first direction. The second direction is defined as an X direction, a side toward X1 is defined as one side in the second direction, and a side toward X2 is defined as another side in the second direction. A third direction perpendicular to the first direction and the second direction is defined as a Z direction, a side toward Z1 is defined as one side in the third direction, and a side toward Z2 is defined as another side in the third direction. In the present embodiment, the power body portions 32a, 32b, 32c storing the plurality of semiconductor elements 34 separately in a plurality of portions are provided. However, the plurality of semiconductor elements 34 may be collectively stored in one power body portion, and the power module unit 3 may be composed of the one power body portion.

In FIG. 1, the semiconductor elements 34 are shown by broken lines. However, the number of semiconductor elements 34 stored in one power body portion is not limited to one, and the power body portion stores one or a plurality of semiconductor elements 34. The power module unit 3 further includes output terminals 33 and a plurality of control terminals (not shown). The output terminals 33 and the control terminals are provided so as to protrude outward from the power body portions. In the present embodiment, a plurality of output terminals 33 protrude toward the other side in the X direction from the power body portion and are arranged in the Y direction. Parts corresponding to the power body portions 32a, 32b, 32c shown in FIG. 1 are, for example, cases or protection members such as sealing resins surrounding the semiconductor elements 34. If cases are used, resin may be provided inside the cases. The power terminals 31, the output terminals 33, and the control terminals are made of copper which is small in electrical resistivity and excellent in electric conductivity, for example. The power terminals 31 are electrically connected to capacitor busbars 42 of the capacitor module 4. The capacitor busbars 42 are busbars connecting capacitor elements 41 and the power module unit 3.

<Housing 2>

The housing 2 is made of metal such as aluminum. As shown in FIG. 4, the housing 2 is formed in a bottomed tubular shape, for example. The housing 2 has a first surface 2a to which the power module unit 3 is thermally connected and a second surface 2b to which the capacitor module 4 is thermally connected. A coolant path 21 for cooling the first surface 2a is provided on the back side of the first surface 2a. A part of the housing 2 where the coolant path 21 is provided is a path forming portion 23. The coolant path 21 is a path in which a coolant flows. As the coolant, for example, water or an ethylene glycol solution is used. As shown in FIG. 4, the second surface 2b faces toward the one side in the Z direction and is located on the one side in the X direction of the first surface 2a and on the other side in the Z direction relative to the first surface 2a. The housing 2 has a step portion 2c between the first surface 2a and the second surface 2b. The coolant path 21 is located on the other side in the X direction of the step portion 2c.

A part of the housing 2 that has the first surface 2a is a base portion 22 formed in a plate shape. The base portion 22 is made of, for example, metal such as aluminum, as with a body part of the housing 2. However, without limitation thereto, the base portion 22 may be made of a resin member having high thermal conductivity. A back surface of the base portion 22 on the back side of the first surface 2a forms a part of the inner surface of the coolant path 21. One or a plurality of cooling fins 22a are provided on the back surface of the base portion 22 in an area overlapping the power body portion 32a, as seen from the one side in the Z direction. The coolant path 21 includes an upstream-side path 21a, a downstream-side path 21b, and an intermediate path 21c. The intermediate path 21c is a path in which the coolant flows through the cooling fins 22a from the one side in the X direction to the other side in the X direction. The upstream-side path 21a is a path connected to the one side in the X direction of the intermediate path 21c and extending in the Y direction. The downstream-side path 21b is a path connected to the other side in the X direction of the intermediate path 21c and extending in the Y direction.

The coolant flows through the upstream-side path 21a, the intermediate path 21c, and the downstream-side path 21b in this order. As shown in FIG. 1, the path forming portion 23 has coolant inlet/outlet ports 23a. The coolant inlet/outlet ports 23a are flow-in/out ports through which the coolant flows into the coolant path 21 or the coolant flows out from the coolant path 21. The coolant inlet/outlet ports 23a are provided so as to protrude from an outer wall surface of the housing 2. The upstream-side path 21a is located so as to overlap an area between the power body portions 32a, 32b, 32c and a capacitor case 45, as seen from the one side in the Z direction. With this structure, the coolant having a low temperature before cooling the power module unit 3 flows in the upstream-side path 21a, and therefore the step portion 2c and the second surface 2b which are located adjacently to the first surface 2a are also efficiently cooled by the upstream-side path 21a. Since the second surface 2b is cooled, the capacitor module 4 thermally connected to the second surface 2b can be cooled.

<Capacitor Module 4>

The capacitor module 4 includes the capacitor elements 41, the capacitor case 45 storing the capacitor elements 41 with capacitor sealing resin 44 interposed, and the capacitor busbars 42 connected to the capacitor elements 41. Each capacitor element 41 has capacitor electrodes 43 at both ends. Each capacitor electrode 43 is a positive electrode or a negative electrode. Each capacitor busbar 42 is electrically connected to the capacitor element 41 on the one side in the X direction and is electrically connected to the power terminal 31 on the other side in the X direction. The capacitor busbar 42 is made of copper which is small in electric resistivity and excellent in electric conductivity, for example. The capacitor busbar 42 and the power terminal 31 are connected to each other by welding at an end of a power terminal connection portion 423 via which both members contact with each other. A connection method for the capacitor busbar 42 and the power terminal 31 is not limited to welding, and they may be connecting by soldering, fitting, or screwing. The details of the capacitor busbar 42 will be described later.

In the present embodiment, the capacitor case 45 is formed in a bottomed tubular shape. The capacitor case 45 is manufactured by molding with resin or die casting with aluminum, for example. The capacitor sealing resin 44 is a member made of epoxy resin or the like and having insulating property. The material and the shape of the capacitor case are not limited thereto. The capacitor case 45 made of resin may directly store the capacitor element 41. A bottom wall 45b of the capacitor case 45 is formed in a rectangular shape, for example. The capacitor case 45 has an opening 45a which is an opened part of the capacitor case 45 on the side opposite to the bottom wall 45b. Each capacitor busbar 42 protrudes through the opening 45a from the capacitor sealing resin 44. In the present embodiment, the capacitor case 45 is placed with the opening 45a facing toward the one side in the Z direction, and the capacitor busbar 42 protrudes toward the one side in the Z direction from the capacitor sealing resin 44. Placement of the capacitor case 45 is not limited thereto, and the capacitor case 45 may be placed with the opening 45a facing toward the other side in the X direction so that the capacitor busbar 42 protrudes toward the power module unit 3 side from the capacitor sealing resin 44.

The outer surface of the bottom wall 45b of the capacitor case 45 and the second surface 2b of the housing 2 are thermally connected to each other. The way of thermal connection is not limited to a case where the bottom wall 45b and the second surface 2b are connected by directly contacting with each other. The bottom wall 45b and the second surface 2b may be thermally connected to each other via a heat transfer member such as grease. By thermally connecting the capacitor case 45 to the housing 2, heat of the capacitor element 41 can be dissipated from the bottom wall 45b side of the capacitor case 45, whereby heat dissipation performance for the capacitor element 41 can be improved. Similarly, in a case where the capacitor case 45 is placed with the opening 45a facing toward the other side in the X direction, heat of the capacitor element 41 can be dissipated from a side wall portion of the capacitor case 45 that is adjacent to the opening 45a and the bottom wall 45b thereof and contacts with the second surface 2b of the housing 2.

The capacitor element 41 smooths DC power. The capacitor element 41 is a film capacitor of a wound type having a stacked structure. The capacitor element 41 has metal films stacked while a dielectric material which is a member having insulating property is interposed. The capacitor element 41 has the capacitor electrodes 43 at end surfaces on the one side and the other side in the Z direction crossing the X direction corresponding to the stacking direction of the metal films. In the present embodiment, one capacitor electrode 43 is located on the bottom wall 45b side and the other capacitor electrode 43 is located on the opening 45a side. Placement of the capacitor electrodes 43 is not limited thereto. The capacitor electrodes 43 may be provided at a side part of the capacitor element 41 located between the bottom wall 45b side and the opening 45a side of the capacitor element 41. The thermal conductivity of the metal films is higher than the thermal conductivity of the dielectric material. Therefore, the thermal conductivity of the capacitor element 41 is higher in a direction crossing the stacking direction of the metal films than in the X direction corresponding to the stacking direction of the metal films. When the capacitor electrode 43 and the bottom wall 45b are located on the other side in the Z direction as in the present embodiment, the thermal conductivity of the capacitor element 41 is higher on the other side in the Z direction. Therefore, if the direction in which the thermal conductivity of the capacitor element 41 is high is aligned with the direction of the heat dissipation path where the bottom wall 45b of the capacitor case 45 is located, it is possible to dissipate heat of the capacitor element 41 to the bottom wall 45b side of the capacitor case 45 more efficiently.

In the present embodiment, the capacitor case 45 stores three capacitor elements 41. In FIG. 1, the outer shapes of the capacitor elements 41 are indicated by broken lines. The number of capacitor elements 41 is not limited to three. A plurality of power body portions may be connected to one capacitor element 41, or a plurality of capacitor elements 41 and one power body portion may be connected to each other. Even in a case where one capacitor element 41 is provided, a plurality of element connection portions 425 described later are provided. This is for suppressing biasing of a current path.

In the present embodiment, a plurality of power body portions 32a, 32b, 32c are provided so as to be arranged in the Y direction. The capacitor module 4 is located on the one side in the X direction of the plurality of power body portions 32a, 32b, 32c so as to overlap the plurality of power body portions 32a, 32b, 32c, as seen in the X direction. Each capacitor busbar 42 has a flat-plate portion 421 extending toward the other side in the X direction from the capacitor elements 41 toward the plurality of power body portions 32a, 32b, 32c, as seen from the one side in the Z direction. With this structure, the capacitor elements 41 are located closely to the power module unit 3, whereby the capacitor elements 41 and the power module unit 3 can be connected to each other with low wiring inductances.

<Capacitor Busbars 42>

The capacitor busbars 42 which are major parts of the present disclosure will be described with reference to FIG. 2 and FIG. 3. Each capacitor busbar 42 includes the flat-plate portion 421, a plurality of power terminal connection portions 423, the power supply connection portion 422, and a plurality of element connection portions 425. The flat-plate portion 421 is formed in a plate shape of which the width in the Y direction is greater than the width in the X direction, and is exposed to outside from the capacitor sealing resin 44. The plurality of power terminal connection portions 423 extend toward the other side in the X direction from the flat-plate portion 421, and are arranged in the Y direction. The plurality of power terminal connection portions 423 are respectively connected to the plurality of power terminals 31. The power supply connection portion 422 is connected to the flat-plate portion 421 and connected to the DC power supply 5. The plurality of element connection portions 425 are connected to the flat-plate portion 421 and are located on the one side in the X direction relative to the flat-plate portion 421. The plurality of element connection portions 425 are arranged in the Y direction and are connected to the capacitor elements 41. Since the capacitor elements 41 are stored in the capacitor case 45 with the capacitor sealing resin 44 interposed, the plurality of element connection portions 425 extend inside the capacitor sealing resin 44 so as to be opposed to the capacitor electrodes 43, and then are connected to the capacitor elements 41. The flat-plate portion 421 serving as a current path between the capacitor elements 41 and the power module unit 3, and a current path between the DC power supply 5 and the power module unit 3, is exposed to outside from the capacitor sealing resin 44. Thus, heat dissipation of the capacitor busbar 42 can be improved.

In the present embodiment, the power supply connection portion 422 has a DC path portion 424 which is a part exposed to outside from the capacitor sealing resin 44 and connected to the flat-plate portion 421, and a DC connection portion 426 which is a part connected to the DC path portion 424 and connected to the DC power supply 5. The DC path portion 424 is a part where DC current flows, between the flat-plate portion 421 and the DC connection portion 426. Since the DC path portion 424 is exposed to outside of the capacitor sealing resin 44, heat of the capacitor busbar 42 can be efficiently dissipated. The power supply connection portion 422 is not limited to the structure having the DC path portion 424 and the DC connection portion 426, and the power supply connection portion 422 may be formed by only the DC connection portion 426. However, by providing the DC path portion 424, the degree of freedom in placement of the power supply connection portion 422 can be improved.

As the capacitor busbars 42, a first capacitor busbar and a second capacitor busbar are provided. One of the first capacitor busbar and the second capacitor busbar is a positive busbar 42a, and the other of the first capacitor busbar and the second capacitor busbar is a negative busbar 42b. The positive busbar 42a is connected to the power terminals 31 for the positive side, and the negative busbar 42b is connected to the power terminals 31 for the negative side.

The capacitor element 41 has a first electrode which is the capacitor electrode 43 connected to the first capacitor busbar, and a second electrode which is the capacitor electrode 43 connected to the second capacitor busbar. One of the first electrode and the second electrode is located on a side of the capacitor element 41 toward the bottom wall 45b of the capacitor case 45, and the other of the first electrode and the second electrode is located on a side of the capacitor element 41 toward the opening 45a of the capacitor case 45.

In the present embodiment, as shown in FIG. 4 and FIG. 5, the one of the first electrode and the second electrode is a bottom-wall-side electrode 43b, and the other of the first electrode and the second electrode is an opening-side electrode 43a. In the capacitor sealing resin 44, the negative busbar 42b is connected to the bottom-wall-side electrode 43b, and the positive busbar 42a is connected to the opening-side electrode 43a. Although, in the present embodiment, the opening-side electrode 43a is the positive electrode and the bottom-wall-side electrode 43b is the negative electrode, either the opening-side electrode 43a or the bottom-wall-side electrode 43b may be the positive electrode. The capacitor busbar 42 connected to the positive electrode is the positive busbar 42a, and the capacitor busbar 42 connected to the negative electrode is the negative busbar 42b.

As shown in FIG. 2 and FIG. 3, an element-connection-portion position range (denoted by YC in the drawings) which is a position range in the Y direction between two element connection portions located at both ends in the first direction among the plurality of element connection portions 425, and a power-terminal-connection-portion position range (denoted by YP in the drawings) which is a position range in the first direction between two power terminal connection portions located at both ends in the Y direction among the plurality of power terminal connection portions 423, are within a position range (denoted by YF in the drawings) in the Y direction where the flat-plate portion 421 is located. In addition, the length of the element-connection-portion position range and the length of the power-terminal-connection-portion position range are equivalent to each other, and the center position of the element-connection-portion position range and the center position of the power-terminal-connection-portion position range are equivalent to each other.

A state in which the length of the element-connection-portion position range and the length of the power-terminal-connection-portion position range are equivalent to each other, means that the difference between the length of the element-connection-portion position range and the length of the power-terminal-connection-portion position range is within 25% of the length of the element-connection-portion position range. As shown in FIG. 1, in a case where a plurality of capacitor elements 41 are provided and the capacitor electrode 43 is formed to have a short-side direction and a long-side direction, the difference between the length of the element-connection-portion position range and the length of the power-terminal-connection-portion position range may be not greater than the length in the short-side direction of the capacitor electrode 43.

A state in which the center position of the element-connection-portion position range and the center position of the power-terminal-connection-portion position range are equivalent to each other, means that the difference between the center position of the element-connection-portion position range and the center position of the power-terminal-connection-portion position range is within 20% of the length of the element-connection-portion position range. As shown in FIG. 1, in a case where a plurality of capacitor elements 41 are provided and the capacitor electrode 43 is formed to have a short-side direction and a long-side direction, the difference between the center position of the element-connection-portion position range and the center position of the power-terminal-connection-portion position range may be not greater than half the length in the short-side direction of the capacitor electrode 43.

With this structure, the capacitor busbar 42 has a sufficient width in the Y direction, in the current path in the X direction between the plurality of element connection portions 425 connected to the capacitor electrodes 43 and the plurality of power terminal connection portions 423 connected to the power terminals 31. Thus, increase in the electric resistance of this current path is suppressed, whereby increase in the wiring inductances between the capacitor elements 41 and the power module unit 3 can be suppressed. Since increase in the wiring inductances is suppressed, occurrence of extra loss in the capacitor busbar 42 connecting the capacitor elements 41 and the power module unit 3 can be suppressed. Since occurrence of loss in the capacitor busbar 42 is suppressed, heat generation due to Joule heat of the capacitor busbar 42 is suppressed, whereby the capacitor elements 41 can be protected from temperature increase.

In the present embodiment, as seen in the X direction, 80% or more of the element-connection-portion position range overlaps the power-terminal-connection-portion position range, and 80% or more of the power-terminal-connection-portion position range overlaps the element-connection-portion position range. By setting the element-connection-portion position range and the power-terminal-connection-portion position range as described above, it is possible to easily suppress increase in the wiring inductances between the capacitor elements 41 and the power module unit 3 by only the degree of the above overlap.

<Flat-Plate Portions 421>

The details of the structures of the flat-plate portions 421 in the first embodiment will be described. In the present embodiment, a first flat-plate portion which is the flat-plate portion of the first capacitor busbar and a second flat-plate portion which is the flat-plate portion of the second capacitor busbar are located so as to be opposed to each other. As shown in FIG. 4 and FIG. 5, the first flat-plate portion 421*a* is provided to the positive busbar 42*a*, and the second flat-plate portion 421*b* is provided to the negative busbar 42*b*. In a case where the first flat-plate portion 421*a* and the second flat-plate portion 421*b* are located so as to be opposed to each other as described above, the projected area occupied by the capacitor busbars 42 in the power conversion device 1 can be reduced, whereby the power conversion device 1 can be downsized. In addition, in the area of the flat-plate portions 421 where the positive busbar 42*a* and the negative busbar 42*b* are opposed to each other, wiring inductances are canceled by each other, whereby the wiring inductances in the capacitor busbars 42 can be significantly reduced. The parts of the positive busbar 42*a* and the negative busbar 42*b* that are opposed to each other are not limited to the flat-plate portions 421, and other portions such as the DC path portions 424 may be further opposed to each other.

In the present embodiment, a spacer 420 having insulating property is provided between the first flat-plate portion 421*a* and the second flat-plate portion 421*b*. The spacer 420 made of a resin member is formed by molding with resin, for example. In a case where the spacer 420 having insulating property is provided, the distance between the first flat-plate portion 421*a* and the second flat-plate portion 421*b* can be shortened. Since the distance between the first flat-plate portion 421*a* and the second flat-plate portion 421*b* is shortened, the wiring inductances in the capacitor busbars 42 can be further reduced. Setting the distance between the first flat-plate portion 421*a* and the second flat-plate portion 421*b* to not greater than 1.5 mm is favorable for reducing the wiring inductances. The part where the spacer 420 is provided is not limited to the flat-plate portions 421, and the spacer 420 may be further provided at a part where other portions such as the DC path portions 424 are opposed to each other.

<DC Path Portions 424>

Each DC path portion 424 extends toward the one side in the X direction from a part of the flat-plate portion 421 that is positioned on the one side in the X direction on the one side or the other side in the Y direction. In the present embodiment, as shown in FIG. 2 and FIG. 3, each DC path portion 424 extends toward the one side in the X direction from a part on the one side in the X direction away from the element connection portions 425, on the one side in the Y direction of the flat-plate portion 421. The positive busbar 42*a* extends to be longer toward the one side in the X direction than the negative busbar 42*b*. The respective DC connection portions 426 of the positive busbar 42*a* and the negative busbar 42*b* extend in the Y direction from areas on the one side in the X direction of the respective DC path portions 424 of the positive busbar 42*a* and the negative busbar 42*b*. Placement of the DC connection portions 426 is not limited thereto, and for example, the DC connection portions 426 may extend toward the one side in the X direction from the DC path portions 424.

As shown in FIG. 1, the DC path portion 424 is located so as to overlap the capacitor sealing resin 44, as seen in the Z direction. With this structure, since the DC path portion 424 and the capacitor sealing resin 44 overlap each other, a part of the DC path portion 424 exposed to outside does not protrude outward from the capacitor case 45, so that the power conversion device 1 can be downsized. In addition, since the DC path portion 424 and the element connection portions 425 are located away from each other, heat generated in the DC path portion 424 can be inhibited from transferring through the element connection portions 425 to the capacitor elements 41.

<Element Connection Portions 425>

In the present embodiment, the element connection portions 425 are provided inside the capacitor sealing resin 44 adjacent to the capacitor elements 41. The element connection portions 425 are connected to the one side in the X direction of the flat-plate portion 421 by a connection part which has a plurality of bending portions and is wide in the Y direction. Without limitation to this structure, parts of the element connection portions 425 provided inside the capacitor sealing resin 44 may extend to the one side in the X direction of the flat-plate portion 421 with no connection part provided. As in the present embodiment, since the element connection portions 425 are connected to the flat-plate portion 421 by the connection part which is wide in the Y direction, increase in the wiring inductances between the capacitor elements 41 and the power module unit 3 can be suppressed.

As seen in the Z direction, an area of the first electrode that overlaps the element connection portions 425 of the first capacitor busbar is smaller than an area of the first electrode that does not overlap the element connection portions 425 of the first capacitor busbar, and an area of the second electrode that overlaps the element connection portions 425 of the second capacitor busbar is smaller than an area of the second electrode that does not overlap the element connection portions 425 of the second capacitor busbar. In the present embodiment, an area of the opening-side electrode 43*a* that overlaps the element connection portions 425 of the positive busbar 42*a* is smaller than an area of the opening-side electrode 43*a* that does not overlap the element connection portions 425 of the positive busbar 42*a*, and an area of the bottom-wall-side electrode 43*b* that overlaps the element connection portions 425 of the negative busbar 42b is smaller than an area of the bottom-wall-side electrode 43b that does not overlap the element connection portions 425 of the negative busbar 42b.

With this structure, since the element connection portions 425 are connected to the opening-side electrode 43a and the bottom-wall-side electrode 43b in areas close to the other side in the X direction of the opening-side electrode 43a and the bottom-wall-side electrode 43b, the area where the capacitor busbar 42 and the capacitor element 41 overlap each other need not be enlarged more than necessary, so that cost increase due to volume increase in the capacitor busbar 42 can be suppressed. In addition, heat can be inhibited from transferring from the capacitor busbar 42 to the capacitor element 41.

In the present embodiment, as shown in FIG. 4, the element connection portion 425 has a protrusion 4250 protruding toward the capacitor element 41, at an end on the capacitor element 41 side. The opening-side electrode 43a of the capacitor element 41 and the protrusion 4250 are connected to each other by soldering or welding, for example.

With this structure, in an area of the element connection portion 425 other than the protrusion 4250, the capacitor sealing resin 44 with an amount corresponding to the protruding height of the protrusion 4250 enters a gap between the element connection portion 425 and the opening-side electrode 43a, so that the thermal resistance between the capacitor busbar 42 and the opening-side electrode 43a increases. Therefore, heat generated in the capacitor busbar 42 can be inhibited from transferring to the capacitor element 41. Without limitation to this structure, in an area other than the joining part between the element connection portion 425 and the opening-side electrode 43a, a member having higher thermal conductivity than the capacitor sealing resin 44 may be interposed between the capacitor busbar 42 and the capacitor element 41. The protrusion 4250 may be provided on the bottom-wall-side electrode 43b side. The protrusion 4250 may be provided at a joining part with a ground-side capacitor element described below.

<Ground-Side Capacitor Elements 410>

Ground-side capacitor elements 410 will be described. As shown in FIG. 9, the power conversion device 1 further includes the ground-side capacitor elements 410 connected between the ground, and the positive busbar 42a and the negative busbar 42b which are the capacitor busbars 42. In the present embodiment, as shown in FIG. 6, two ground-side capacitor elements 410 are stored in the capacitor case 45 with the capacitor sealing resin 44 interposed. Placement of the ground-side capacitor elements 410 is not limited thereto, and they may be provided outside the capacitor case 45. The ground-side capacitor elements 410 are Y capacitors for removing noise between the ground, and the positive busbar 42a and the negative busbar 42b.

As seen in the Y direction, each ground-side capacitor element 410 is located so as to partially overlap the capacitor element 41. The ground-side capacitor element 410 is a film capacitor, as with the capacitor element 41. The size of the ground-side capacitor element 410 is smaller than the size of the capacitor element 41. The ground-side capacitor element 410 has ground-side capacitor electrodes 430 at both end surfaces in the X direction crossing the Y direction corresponding to the stacking direction of the metal films. A positive/negative electrode 430a which is the ground-side capacitor electrode 430 connected to the positive busbar 42a or the negative busbar 42b is located on the one side in the X direction. The ground-side capacitor electrode 430 on the side opposite to the positive/negative electrode 430a is a GND electrode 430b connected to one end of a GND busbar 46. Another end of the GND busbar 46 is connected to the ground.

In the present embodiment, each ground-side capacitor electrode 430 is formed to have a short-side direction and a long-side direction. The ground-side capacitor element 410 is formed such that the length between the positive/negative electrode 430a and the GND electrode 430b which is the length between both ends surfaces in the X direction is greater than the length in the Z direction which is the long-side direction of the ground-side capacitor electrode 430. Therefore, in order that the dimension in the Y direction of the capacitor case 45 is minimized, the ground-side capacitor electrodes 430 are provided so as to be arranged in the X direction and thus are located so that the two ground-side capacitor elements 410 overlap each other, as seen in the X direction. Placement of the two ground-side capacitor elements 410 is not limited thereto, and the two ground-side capacitor electrodes 430 may face toward the one side in the Z direction. The length between the positive/negative electrode 430a and the GND electrode 430b may be smaller than the length in the short-side direction of the ground-side capacitor electrode 430, and the ground-side capacitor electrode 430 may face in the Y direction. The number of the ground-side capacitor elements 410 is not limited to two. A plurality of Y capacitors may be connected to the GND electrode 430b, or the GND electrodes 430b of the plurality of ground-side capacitor elements 410 may be connected in parallel to one GND busbar 46.

In the present embodiment, each DC path portion 424 may be located so as to at least partially overlap the ground-side capacitor element 410, as seen in the Z direction. With this structure, the power conversion device 1 can be downsized while the effect of removing noise is obtained. In addition, in the present embodiment, the ground-side capacitor element 410 is located on the opening 45a side which is an opened side opposite to the bottom wall side of the capacitor case 45 formed in a bottomed tubular shape. With this structure, the ground-side capacitor element 410 can be located closely to the DC connection portion 426. Since the DC connection portion 426 and the ground-side capacitor element 410 are close to each other, the wiring inductance between the DC connection portion 426 and the ground-side capacitor element 410 can be reduced. Since the wiring inductance is reduced, the effect of the ground-side capacitor element 410 to remove noise can be increased.

<Support Portions 47 and Spacer Support Portion 420b>

Support portions 47 will be described. Each DC path portion 424 has the support portion 47 extending from the DC path portion 424 into the capacitor sealing resin 44. In the present embodiment, as shown in FIG. 2, the positive busbar 42a has two support portions 47a, 47b, and as shown in FIG. 3, the negative busbar 42b has one support portion 47c. Each support portion 47 is formed integrally with the DC path portion 424 and is provided so as to be bent toward the other side in the Z direction. With the support portions 47 provided, since the support portions 47 are fixed to the capacitor sealing resin 44, vibration of a part of the capacitor busbar 42 exposed from the capacitor sealing resin 44 can be suppressed. As with the positive busbar 42a, the DC path portion 424 may have a plurality of support portions 47. In a case where the DC path portion 424 has a plurality of support portions 47, the effect of suppressing vibration of the capacitor busbar 42 can be further increased.

As shown in FIG. 6, the support portion 47a is connected to the positive/negative electrode 430a which is one electrode of the ground-side capacitor element 410. The support portion 47c is connected to the positive/negative electrode 430a which is one electrode of the ground-side capacitor element 410. The support portions 47a, 47c connected to the positive/negative electrodes 430a are ground-side capacitor terminals. Each support portion 47a, 47c is located on the one side in the X direction of the DC path portion 424. The GND electrode 430b which is the other electrode of the ground-side capacitor element 410 is connected to the ground. Since the support portions 47a, 47c have functions as ground-side capacitor terminals as well as fixation functions, it is not necessary to newly provide ground-side capacitor terminals, so that the number of components of the power conversion device 1 can be decreased. Since the number of components of the power conversion device 1 is decreased, the cost for the power conversion device 1 can be reduced.

The support portion 47b is a vibration-resistant anchor whose end has no electric connection inside the capacitor sealing resin 44. The support portion 47b is located on the other side in the X direction of the DC path portion 424. Thus, the support portion 47b is located on the flat-plate portion 421 side relative to the DC connection portion 426 side at the DC path portion 424. With this structure, the support portion 47b is located adjacently to a free end on the one side in the Y direction of the flat-plate portion 421 away from the element connection portions 425 and the power terminal connection portions 423, whereby the vibration resistance of the flat-plate portion 421 can be improved.

In the present embodiment, of the capacitor busbars 42, only the positive busbar 42a of which the free end on the one side in the Y direction of the flat-plate portion 421 is wide in the X direction and the length in the X direction of the DC path portion 424 is great, has the support portion 47b which is a vibration-resistant anchor, whereby the vibration resistance of the positive busbar 42a is improved. Placement of the support portion 47b is not limited thereto. Depending on various shapes of the capacitor busbar 42, the vibration-resistant anchor may be removed, the position thereof may be changed, or another vibration-resistant anchor may be added. As the support portion 47, only either the ground-side capacitor terminal or the vibration-resistant anchor may be provided, or a plurality of support portions 47 may be provided at different positions.

In the present embodiment, the DC path portion 424 is formed in a plate shape, and the DC connection portion 426 and the support portion 47b are provided at the same side surface of the DC path portion 424, as seen in the Z direction. Before the support portion 47b is bent toward the other side in the Z direction, the DC connection portion 426 and the support portion 47b extend in the same direction. In manufacturing of the positive busbar 42a, the DC connection portion 426 and the support portion 47b extend in the same direction, and therefore manufacturing of the positive busbar 42a is facilitated, leading to improvement in the yield of the positive busbar 42a.

Figure 10:
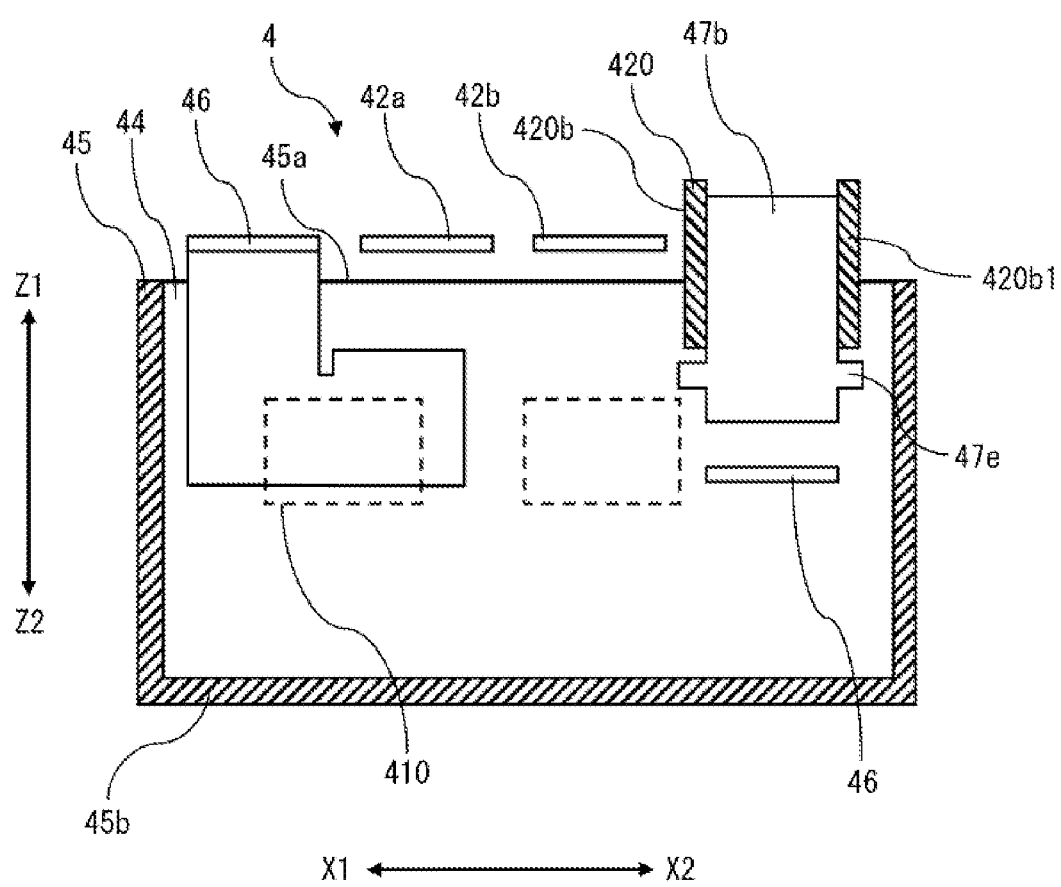
FIG. 10 is a sectional view of another power conversion device according to the first embodiment.

The support portion 47b is formed in a plate shape, and the support portion 47b has, at a part extending into the capacitor sealing resin 44, one or both of a part cut out inward from a side surface and a part protruding toward the capacitor sealing resin 44 side from a side surface. In the present embodiment, as shown in FIG. 7, the support portion 47b has two cutouts 47d which are parts cut out inward from side surfaces. In another power conversion device 1 shown in FIG. 10, the support portion 47b has two projections 47e which are parts protruding toward the capacitor sealing resin 44 side from side surfaces. FIG. 10 is a sectional view of the power conversion device 1 taken at a position equivalent to FIG. 7. The numbers of the cutouts 47d and the projections 47e are not limited thereto, and may be one, or three or more. Both of the cutout 47d and the projection 47e may be provided to the support portion. The cutout 47d and the projection 47e may be located at different positions in the X direction.

With this structure, the support portion 47b contacts with the capacitor sealing resin 44 at a plurality of parts of the cutouts 47d or the projections 47e, whereby adhesion between the capacitor sealing resin 44 and the support portion 47b can be improved. Since adhesion between the capacitor sealing resin 44 and the support portion 47b is improved, the vibration resistance of the flat-plate portion 421 can be further improved. A structure provided to the support portion 47b is not limited to the cutouts 47d or the projections 47e. For example, the support portion 47b may have a shape bent in the Y direction, or may have any other shape such that a part of the support portion 47b bites into the capacitor sealing resin 44.

A spacer support portion 420b will be described. In the present embodiment, the spacer 420 has an opposed portion 420a and the spacer support portion 420b. As shown in FIG. 4, the opposed portion 420a is a part of the spacer 420 held between the first flat-plate portion 421a and the second flat-plate portion 421b. As shown in FIG. 8, the spacer support portion 420b is a part extending in a direction of the DC path portion 424 from the opposed portion 420a and extending into the capacitor sealing resin 44 along the support portion 47b. With this structure, the vibration resistance of the spacer 420 can be improved by the spacer support portion 420b. As shown in FIG. 6, the spacer support portion 420b may extend into the capacitor sealing resin 44 at a part away from the support portion 47.

In the present embodiment, the spacer support portion 420b has a tubular portion 420b1 formed in a tubular shape surrounding the periphery of the support portion 47b, and the tubular portion 420b1 extends into the capacitor sealing resin 44. The tubular portion 420b1 surrounds the periphery of the support portion 47b at a boundary part between the capacitor sealing resin 44 and outside. With this structure, the spacer support portion 420b can improve the vibration resistance of the spacer 420 and can increase the resin creeping distance between the GND busbar 46 and the support portion 47b which is a vibration-resistant anchor which needs to be insulated. Since the resin creeping distance between the support portion 47b and the GND busbar 46 is increased, the distance between the support portion 47b and the GND busbar 46 can be made sufficiently close to each other at the boundary part between the capacitor sealing resin 44 and outside, whereby size increase in the capacitor module 4 can be suppressed. Since size increase in the capacitor module 4 is suppressed, the power conversion device 1 can be downsized.

As described above, the power conversion device 1 according to the first embodiment includes the power module unit 3 and the capacitor module 4, and the capacitor busbar 42 includes the flat-plate portion 421, the plurality of power terminal connection portions 423, the power supply connection portion 422, and the plurality of element connection portions 425. The element-connection-portion position range which is the position range in the Y direction between two element connection portions 425 located at both ends in the Y direction among the plurality of element connection portions 425, and the power-terminal-connection-portion position range which is the position range in the Y direction between two power terminal connection portions 423 located at both ends in the Y direction among the plurality of power terminal connection portions 423, are within the position range in the Y direction where the flat-plate portion 421 is located. The length of the element-connection-portion position range and the length of the power-terminal-connection-portion position range are equivalent to each other. The center position of the element-connection-portion position range and the center position of the power-terminal-connection-portion position range are equivalent to each other. Thus, the capacitor busbar 42 has a sufficient width in the Y direction in the current path in the X direction between the plurality of element connection portions 425 connected to the capacitor electrodes 43 and the plurality of power terminal connection portions 423 connected to the power terminals 31, so that increase in the electric resistance of the current path is suppressed, whereby increase in the wiring inductance between the capacitor element 41 and the power module unit 3 can be suppressed. In addition, the flat-plate portion 421 serving as the current path between the capacitor element 41 and the power module unit 3, and the current path between the DC power supply 5 and the power module unit 3, is exposed to outside from the capacitor sealing resin 44. Thus, heat dissipation of the capacitor busbar 42 can be improved.

As seen in the X direction, 80% or more of the element-connection-portion position range may overlap the power-terminal-connection-portion position range, and 80% or more of the power-terminal-connection-portion position range may overlap the element-connection-portion position range. Thus, it is possible to easily suppress increase in the wiring inductance between the capacitor element 41 and the power module unit 3 by an index of only the degree of the above overlap.

The first flat-plate portion which is the flat-plate portion 421 of the first capacitor busbar and the second flat-plate portion which is the flat-plate portion 421 of the second capacitor busbar may be located so as to be opposed to each other. Thus, the projected area occupied by the capacitor busbars 42 in the power conversion device 1 can be reduced, whereby the power conversion device 1 can be downsized. In addition, in the area of the flat-plate portions 421 where the positive busbar 42a and the negative busbar 42b are opposed to each other, wiring inductances are canceled by each other, whereby the wiring inductances in the capacitor busbars 42 can be significantly reduced.

The spacer 420 having insulating property may be provided between the first flat-plate portion 421a and the second flat-plate portion 421b. Thus, the distance between the first flat-plate portion 421a and the second flat-plate portion 421b can be shortened, whereby the wiring inductances in the capacitor busbars 42 can be further reduced.

The DC path portion 424 may extend toward the one side in the X direction from a part of the flat-plate portion 421 that is positioned on the one side in the X direction on the one side or the other side in the Y direction, and the DC path portion 424 may be located so as to overlap the capacitor sealing resin 44, as seen in the Z direction. Thus, the part of the DC path portion 424 exposed to outside does not protrude outward from the capacitor case 45, so that the power conversion device 1 can be downsized. In addition, since the DC path portion 424 and the element connection portions 425 are located away from each other, heat generated in the DC path portion 424 can be inhibited from transferring through the element connection portions 425 to the capacitor element 41.

As seen in the Z direction, the area of the first electrode that overlaps the element connection portions 425 of the first capacitor busbar may be smaller than the area of the first electrode that does not overlap the element connection portions 425 of the first capacitor busbar, and the area of the second electrode that overlaps the element connection portions 425 of the second capacitor busbar may be smaller than the area of the second electrode that does not overlap the element connection portions 425 of the second capacitor busbar. Thus, since the element connection portions 425 are connected to the opening-side electrode 43a and the bottom-wall-side electrode 43b in areas close to the other side in the X direction of the opening-side electrode 43a and the bottom-wall-side electrode 43b, cost increase due to volume increase in the capacitor busbar 42 can be suppressed and heat can be inhibited from transferring from the capacitor busbar 42 to the capacitor element 41.

The DC path portion 424 may be located so as to at least partially overlap the ground-side capacitor element 410, as seen in the Z direction. Thus, the power conversion device 1 can be downsized while the effect of removing noise is obtained. The ground-side capacitor element 410 may be located on the opening 45a side which is an opened side opposite to the bottom wall 45b side of the capacitor case 45 formed in a bottomed tubular shape. Thus, the ground-side capacitor element 410 can be located closely to the DC connection portion 426, whereby the wiring inductance between the DC connection portion 426 and the ground-side capacitor element 410 can be reduced. Since the wiring inductance is reduced, the effect of the ground-side capacitor element 410 to remove noise can be increased.

The DC path portion 424 may have the support portion 47 extending from the DC path portion 424 into the capacitor sealing resin 44. Thus, the support portion 47 is fixed to the capacitor sealing resin 44, whereby vibration of a part of the capacitor busbar 42 exposed from the capacitor sealing resin 44 can be suppressed. The support portion 47a, 47c may be connected to the positive/negative electrode 430a which is one electrode of the ground-side capacitor element 410. Thus, since the support portion 47a, 47c has a function as a ground-side capacitor terminal as well as the fixation function, it is not necessary to newly provide a ground-side capacitor terminal, so that the number of components of the power conversion device 1 can be decreased.

The DC path portion 424 may have a plurality of support portions 47. Thus, the effect of suppressing vibration of the capacitor busbar 42 can be further increased. The support portion 47b may be located on the flat-plate portion 421 side relative to the DC connection portion 426 side at the DC path portion 424. Thus, the support portion 47b is located adjacently to a free end on the one side in the Y direction of the flat-plate portion 421 away from the element connection portions 425 and the power terminal connection portions 423, whereby the vibration resistance of the flat-plate portion 421 can be improved.

The DC path portion 424 may be formed in a plate shape, and the DC connection portion 426 and the support portion 47b may be provided at the same side surface of the DC path portion 424, as seen in the Z direction. Thus, in manufacturing of the positive busbar 42a, the DC connection portion 426 and the support portion 47b extend in the same direction, and therefore manufacturing of the positive busbar 42a is facilitated, leading to improvement in the yield of the positive busbar 42a. The spacer 420 may have the spacer support portion 420b which is a part extending in the direction of the DC path portion 424 from the opposed portion 420a and extending into the capacitor sealing resin 44 along the support portion 47. Thus, the vibration resistance of the spacer 420 can be improved by the spacer support portion 420b.

The spacer support portion 420b may have the tubular portion 420b1 formed in a tubular shape surrounding the periphery of the support portion 47b, and the tubular portion 420b1 may extend into the capacitor sealing resin 44. Thus, the spacer support portion 420b can improve the vibration resistance of the spacer 420 and can increase the resin creeping distance between the GND busbar 46 and the support portion 47b which is a vibration-resistant anchor which needs to be insulated. Since the resin creeping distance between the support portion 47b and the GND busbar 46 is increased, the distance between the support portion 47b and the GND busbar 46 can be made sufficiently close to each other at the boundary part between the capacitor sealing resin 44 and outside, whereby size increase in the capacitor module 4 can be suppressed.

The support portion 47b may be formed in a plate shape, and the support portion 47b may have, at a part extending into the capacitor sealing resin 44, one or both of a part cut out inward from a side surface and a part protruding toward the capacitor sealing resin 44 side from a side surface. Thus, the support portion 47b contacts with the capacitor sealing resin 44 at a plurality of parts of the cutout 47d or the projection 47e, whereby adhesion between the capacitor sealing resin 44 and the support portion 47b can be improved. Since adhesion between the capacitor sealing resin 44 and the support portion 47b is improved, the vibration resistance of the flat-plate portion 421 can be further improved.

The element connection portion 425 may have the protrusion 4250 protruding toward the capacitor element 41, at an end on the capacitor element 41 side, and the capacitor element 41 and the protrusion 4250 may be connected to each other. Thus, the capacitor sealing resin 44 with an amount corresponding to the protruding height of the protrusion 4250 enters a gap between the element connection portion 425 and the opening-side electrode 43a, so that the thermal resistance between the capacitor busbar 42 and the opening-side electrode 43a increases. Therefore, heat generated in the capacitor busbar 42 can be inhibited from transferring to the capacitor element 41.

Second Embodiment

Figure 11:
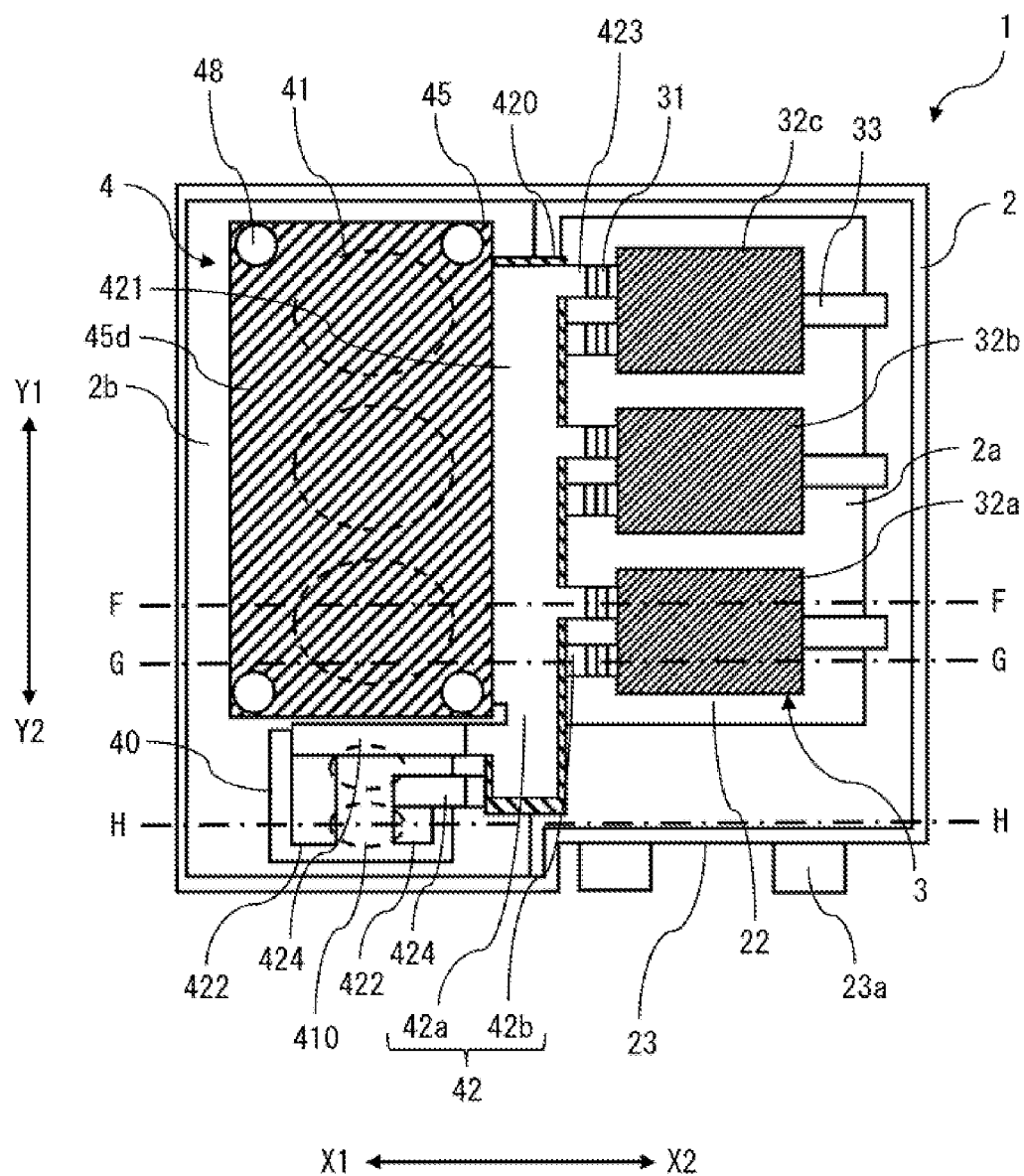
FIG. 11 is a plan view schematically showing a power conversion device according to the second embodiment of the present disclosure.
Figure 12:
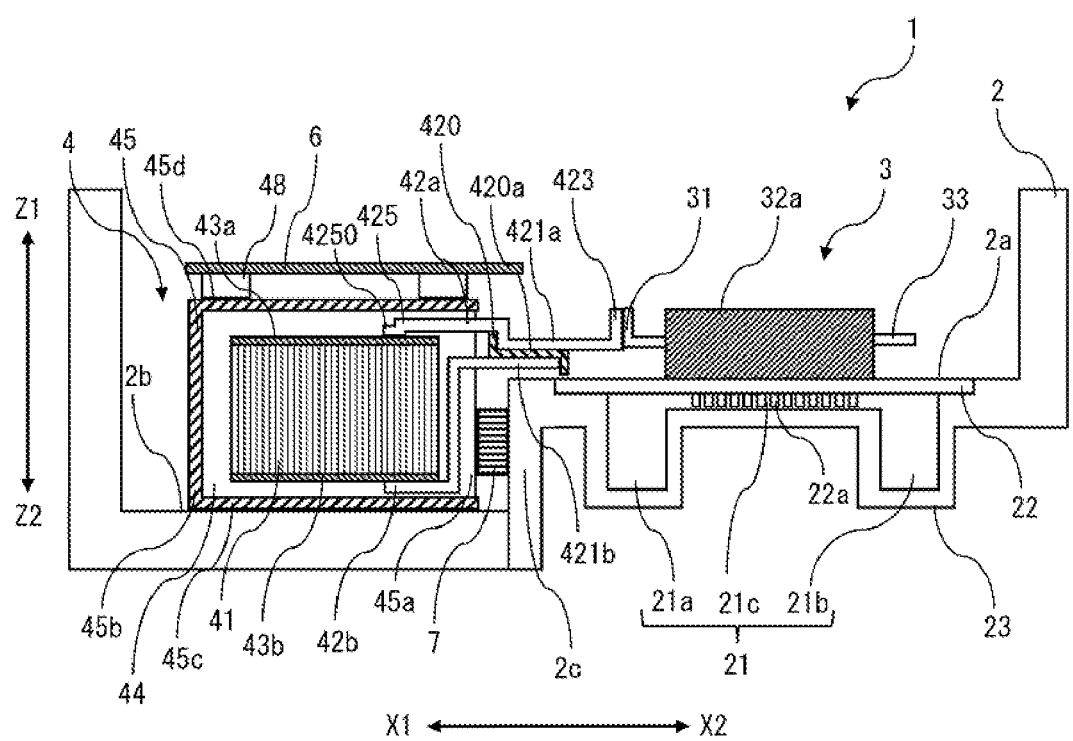
FIG. 12 is a sectional view of the power conversion device taken at an F-F cross-section position in FIG. 11.
Figure 13:
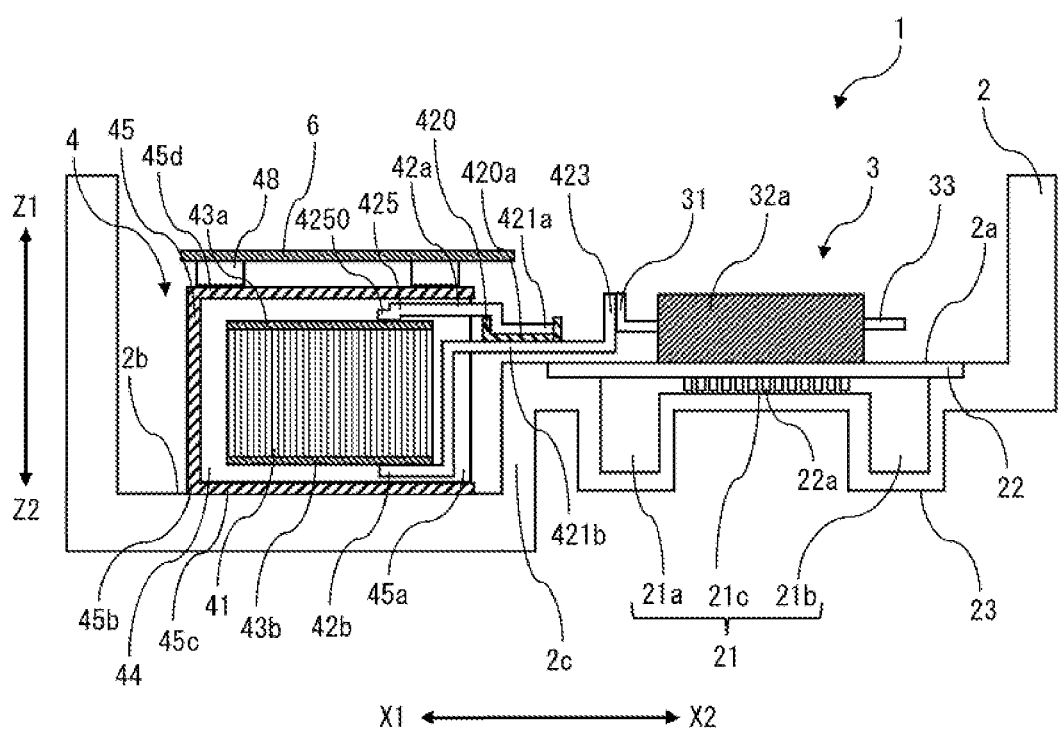
FIG. 13 is a sectional view of the power conversion device taken at a G-G cross-section position in FIG. 11.
Figure 14:
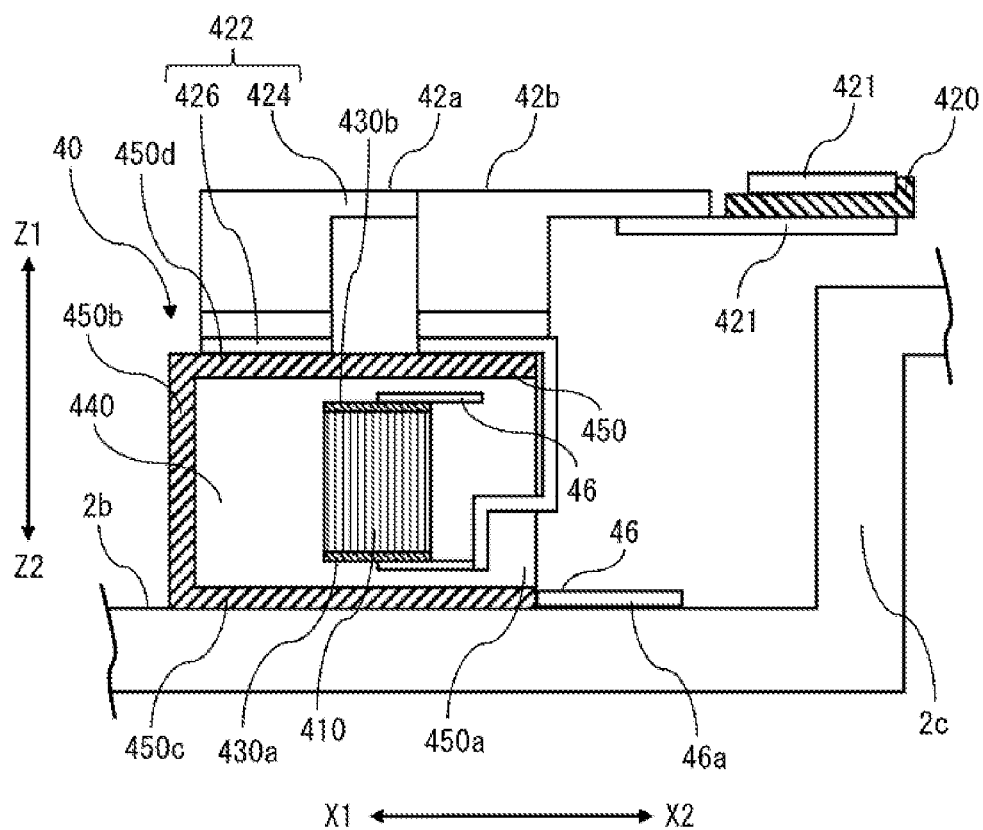
FIG. 14 is a sectional view of the power conversion device taken at an H-H cross-section position in FIG. 11.
Figure 15:
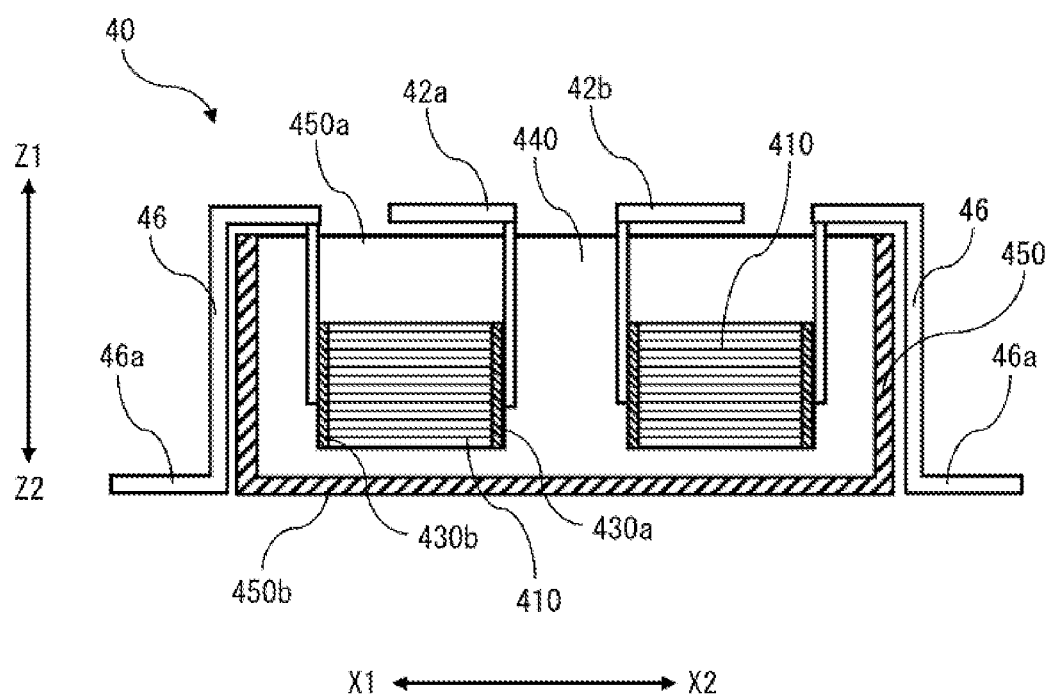
FIG. 15 is a sectional view showing a major part of another power conversion device according to the second embodiment.

A power conversion device 1 according to the second embodiment of the present disclosure will be described. FIG. 11 is a plan view schematically showing the power conversion device 1 according to the second embodiment, in a state in which a control board 6 is removed. FIG. 12 is a sectional view of the power conversion device 1 taken at an F-F cross-section position in FIG. 11. FIG. 13 is a sectional view of the power conversion device 1 taken at a G-G cross-section position in FIG. 11. FIG. 14 is a sectional view of the power conversion device 1 taken at an H-H cross-section position in FIG. 11 and shows a ground-side capacitor module part. FIG. 15 is a sectional view showing a major part of another power conversion device 1 according to the second embodiment and shows a cross-section of another ground-side capacitor module 40. The power conversion device 1 according to the second embodiment further includes the ground-side capacitor module 40, and the ground-side capacitor elements 410 are provided in the ground-side capacitor module 40.

<Ground-Side Capacitor Module 40>

As shown in FIG. 11, the power conversion device 1 includes the capacitor module 4 and the ground-side capacitor module 40. The housing 2 stores the power module unit 3, the capacitor module 4, and the ground-side capacitor module 40. As shown in FIG. 14, the ground-side capacitor module 40 includes the ground-side capacitor elements 410 connected between the capacitor busbar 42 and the ground, and a ground-side capacitor case 450 storing the ground-side capacitor elements 410 with ground-side capacitor sealing resin 440 interposed. The ground-side capacitor case 450 is formed in a bottomed tubular shape, for example. With this structure, the ground-side capacitor module 40 for removing noise is formed separately from the capacitor module 4 for smoothing DC voltage, whereby it is possible to easily replace only the ground-side capacitor module 40. Since replacement of the ground-side capacitor module 40 is easy, the ground-side capacitor module 40 can be easily changed so that the ground-side capacitor module 40 is matched with noise characteristics, so that versatility of the capacitor module 4 can be improved.

In the present embodiment, as shown in FIG. 11, each DC path portion 424 is located so as to at least partially overlap the ground-side capacitor module 40, as seen in the Z direction. With this structure, since the DC path portion 424 and the ground-side capacitor module 40 overlap each other, a part of the DC path portion 424 exposed to outside does not protrude outward from the power conversion device 1, so that the power conversion device 1 can be downsized.

Placement of the capacitor case 45 and the ground-side capacitor case 450 will be described. In one or both of the capacitor module 4 and the ground-side capacitor module 40, the opened side opposite to the bottom wall side of each of the capacitor case 45 and the ground-side capacitor case 450 is opposed to the step portion 2c. In the present embodiment, as shown in FIG. 12, the opening 45a on the opened side of the capacitor case 45 is opposed to the step portion 2c, and as shown in FIG. 14, an opening 450a on the opened side of the ground-side capacitor case 450 is opposed to the step portion 2c. The capacitor case 45 is formed in a bottomed tubular shape that opens toward the other side in the X direction, and a lower wall portion 45c which is a part of a peripheral wall thereof on the second surface 2b side contacts with the second surface 2b. A part of the peripheral wall on the side opposite to the lower wall portion 45c is an upper wall portion 45d.

With this structure, since the opening 45a is opposed to the step portion 2c, heat of the capacitor busbar 42 and the capacitor element 41 can be efficiently dissipated from the opening 45a to the step portion 2c. Similarly, since the opening 450a is opposed to the step portion 2c, heat of the capacitor busbar 42 and the ground-side capacitor element 410 can be efficiently dissipated from the opening 450a to the step portion 2c.

The step portion 2c, and the capacitor module 4 and the ground-side capacitor module 40, are thermally connected to each other via grease, for example. With this structure, the effect of dissipating heat of the capacitor module 4 and the ground-side capacitor module 40 can be further improved. In particular, the step portion 2c, and one or both of the capacitor sealing resin 44 and the capacitor busbar 42, may be thermally connected to each other. In the present embodiment, FIG. 12 shows an example in which the step portion 2c and the capacitor sealing resin 44 are thermally connected to each other via a heat dissipation member 7. The heat dissipation member 7 may be grease, a heat dissipation sheet, or a metal part partially embedded in the capacitor sealing resin 44. Further, the step portion 2c and the ground-side capacitor sealing resin 440 may be thermally connected to each other.

As shown in FIG. 12 and FIG. 13, the capacitor module 4 is placed with the opening 45a facing toward the other side in the X direction. Since the protruding direction of the capacitor busbar 42 protruding from the capacitor sealing resin 44 is a direction toward the power module unit 3, the number of times of bending the capacitor busbar 42 can be decreased and increase in the volume of the capacitor busbar 42 is suppressed, whereby the cost for the capacitor busbar 42 can be reduced.

The capacitor module 4 and the ground-side capacitor module 40 may be placed with the opening 45a and the opening 450a each facing toward the one side in the Z direction, or each opening 45a, 450a may face in different directions. Thus, since the openings of the capacitor case and the ground-side capacitor case 450 can be located so as to face in different directions, the degree of freedom in layout of the capacitor busbar 42 can be increased.

Although, in the first embodiment, the DC path portion 424 and the flat-plate portion 421 are formed integrally with each other, the DC path portion 424 and the flat-plate portion 421 may be formed separately from each other. In the present embodiment, as shown in FIG. 14, the DC path portion 424 and the flat-plate portion 421 are formed separately from each other. The DC path portion 424 is formed in a plate shape, and the thickness of the DC path portion 424 is greater than the thickness of the flat-plate portion 421. The DC path portion 424 and the flat-plate portion 421 are fastened by, for example, a screw (not shown), at a part where they overlap each other. A connection method for the DC path portion 424 and the flat-plate portion 421 is not limited to screwing, and they may be connected by soldering, fitting, or welding. The DC path portion 424 is made of copper which is small in electric resistivity and excellent in electric conductivity, for example.

With this structure, the electric resistance of the DC path portion 424 can be reduced, so that increase in heat generation in the DC path portion 424 can be suppressed, whereby heat can be inhibited from being given to the capacitor element 41 and the ground-side capacitor element 410. In addition, in the capacitor busbar 42, change of the thickness of only the DC path portion 424 part can be easily made, and therefore cost increase due to increase in the thickness of the DC path portion 424 can be suppressed. The DC path portion 424 may be incorporated in an additional resin member different from the ground-side capacitor sealing resin 440 or the capacitor sealing resin 44.

The ground-side capacitor module 40 only has to have such a size in which the ground-side capacitor element 410 can be stored, and therefore the size of the ground-side capacitor case 450 may be smaller than the capacitor case 45. In a case where the size of the ground-side capacitor case 450 is smaller than the size of the capacitor case 45, the total amount of the capacitor sealing resin 44 and the ground-side capacitor sealing resin 440 can be made smaller than the amount of the capacitor sealing resin 44 in the first embodiment.

The DC connection portion 426 is located so as to be stacked on the outer wall of an upper wall portion 450d. The ground-side capacitor element 410 is located near the DC connection portion 426 and near a lower wall portion 450c contacting with the second surface 2b. With this structure, since the ground-side capacitor element 410 is close to the DC connection portion 426, the wiring inductance in the noise filter circuit can be reduced, whereby the effect of removing noise can be improved and the effect of dissipating heat to the housing 2 can be significantly improved.

The GND busbar 46 has a fixation portion 46a fixed to the housing, at an end on the other side in the X direction of the ground-side capacitor case 450. Grounding and fixation of the GND busbar 46 to the housing and fixation of the ground-side capacitor module 40 are made in a shared manner. Thus, complication of an assembly process for the power conversion device 1 is suppressed. A fixation method for the ground-side capacitor module 40 is connection by screwing, welding, fitting, or soldering, for example. The GND busbar 46 may have the fixation portion between the second surface 2b and the lower wall portion 450c opposed to the second surface 2b.

In the structure of the ground-side capacitor module 40 shown in FIG. 14, two ground-side capacitor elements 410 are located adjacently to each other in the Y direction. Each GND electrode 430b is located at an end surface on the one side in the Z direction, and each positive/negative electrode 430a is located at an end surface on the other side in the Z direction. Placement of the ground-side capacitor electrodes 430 is not limited to that shown in FIG. 14. As shown in FIG. 15, two ground-side capacitor elements 410 may be located adjacently to each other in the X direction. In the structure shown in FIG. 15, a bottom wall 450b of the ground-side capacitor case 450 is thermally connected to the second surface 2b (not shown in FIG. 15). In addition, the ground-side capacitor electrode 430 may be provided on the opening 450a side. In a case where the two ground-side capacitor elements 410 are located adjacently to each other in the X direction, size increase in the power conversion device 1 in the Y direction can be suppressed as compared to the structure in which the ground-side capacitor elements 410 are arranged in the Y direction as shown in FIG. 14.

<Control Board 6>

The power conversion device 1 further includes the control board 6 for controlling the power module unit 3. The capacitor case 45 has bushes 48 protruding toward the outer peripheral side, at the upper wall portion 45d which is a part of a peripheral wall thereof on the side opposite to the second surface 2b. In a case where the capacitor case 45 is made of a resin member, the bushes 48 are insert-molded with the capacitor case 45, for example. The control board 6 is fixed to the bushes 48 by screws. With this structure, the control board 6 is located so as to be stacked above the capacitor module 4, whereby size increase in the power conversion device 1 can be suppressed. In addition, since the control board 6 can be easily fixed to the capacitor case productivity of the power conversion device 1 can be improved. In addition, since the number of components for board fixation can be decreased, the cost for the power conversion device 1 can be reduced.

The control board 6 is connected to a control terminal (not shown) extending from the capacitor busbar 42. On the control board 6, an X capacitor for removing noise between wires, and a control circuit such as a discharge resistor for discharging electric charges of the capacitor elements 41, are mounted. The control board 6 is fixed to the capacitor case 45, and the control board 6 and the capacitor busbar 42 can be located closely to each other. Thus, complication of wiring connecting the capacitor busbar 42 and the control board 6 can be suppressed.

As described above, the power conversion device 1 according to the second embodiment further includes the ground-side capacitor module 40, and the DC path portion 424 is located so as to at least partially overlap the ground-side capacitor module 40, as seen in the Z direction. Thus, it is possible to easily replace only the ground-side capacitor module 40, and in addition, since the part of the DC path portion 424 exposed to outside does not protrude outward from the power conversion device 1, the power conversion device 1 can be downsized. In addition, the DC path portion 424 is formed in a plate shape, and the thickness of the DC path portion 424 is greater than the thickness of the flat-plate portion 421. Thus, the electric resistance of the DC path portion 424 can be reduced, so that increase in heat generation in the DC path portion 424 can be suppressed, whereby heat can be inhibited from being given to the capacitor element 41 and the ground-side capacitor element 410.

The housing 2 has the step portion 2c between the first surface 2a and the second surface 2b, and in one or both of the capacitor module 4 and the ground-side capacitor module 40, the opened side opposite to the bottom wall side of each of the capacitor case 45 and the ground-side capacitor case 450 is opposed to the step portion 2c. Thus, heat of the capacitor busbar 42, the capacitor element 41, and the ground-side capacitor element 410 opposed to the step portion 2c can be efficiently dissipated to the step portion 2c. In addition, the step portion 2c, and one or both of the capacitor sealing resin 44 and the capacitor busbar 42, are thermally connected to each other. Thus, the effect of dissipating heat of the capacitor module 4 can be further improved.

The power conversion device 1 further includes the control board 6 for controlling the power module unit 3, the capacitor case 45 has the bush 48 protruding toward the outer peripheral side, at the upper wall portion 45d which is a part of the peripheral wall thereof on the side opposite to the second surface 2b, and the control board 6 is fixed to the bush 48 by a screw. Thus, the control board 6 is located so as to be stacked above the capacitor module 4, whereby size increase in the power conversion device 1 can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

(Additional Note 1)

A power conversion device comprising:
  a power module unit including a plurality of semiconductor elements arranged in a first direction, a power body portion storing the plurality of semiconductor elements separately in a plurality of portions or collectively in one portion, and a plurality of power terminals respectively connected to the plurality of semiconductor elements and protruding from the power body portion toward one side in a second direction perpendicular to the first direction, the plurality of power terminals being arranged in the first direction; and
  a capacitor module including a capacitor element, a capacitor case storing the capacitor element with capacitor sealing resin interposed, and a capacitor busbar connected to the capacitor element, wherein
  the capacitor busbar has
    a flat-plate portion formed in a plate shape of which a width in the first direction is greater than a width in the second direction, the flat-plate portion being exposed to outside from the capacitor sealing resin,
    a plurality of power terminal connection portions extending toward another side in the second direction from the flat-plate portion and arranged in the first direction, the plurality of power terminal connection portions being respectively connected to the plurality of power terminals,
    a power supply connection portion connected to the flat-plate portion and connected to a DC power supply, and
    a plurality of element connection portions connected to the flat-plate portion and located on the one side in the second direction relative to the flat-plate portion, the plurality of element connection portions being arranged in the first direction and connected to the capacitor element,
    an element-connection-portion position range which is a position range in the first direction between two element connection portions located at both ends in the first direction among the plurality of element connection portions, and a power-terminal-connection-portion position range which is a position range in the first direction between two power terminal connection portions located at both ends in the first direction among the plurality of power terminal connection portions, are within a position range in the first direction where the flat-plate portion is located,
    a length of the element-connection-portion position range and a length of the power-terminal-connection-portion position range are equivalent to each other, and
    a center position of the element-connection-portion position range and a center position of the power-terminal-connection-portion position range are equivalent to each other.

(Additional Note 2)

The power conversion device according to additional note 1, wherein
  as seen in the second direction,
    80% or more of the element-connection-portion position range overlaps the power-terminal-connection-portion position range, and
    80% or more of the power-terminal-connection-portion position range overlaps the element-connection-portion position range.

(Additional Note 3)

The power conversion device according to additional note 1 or 2, wherein
  as the capacitor busbar, a first capacitor busbar connected to a first electrode of the capacitor element and a second capacitor busbar connected to a second electrode of the capacitor element are provided, and
  a first flat-plate portion which is the flat-plate portion of the first capacitor busbar and a second flat-plate portion which is the flat-plate portion of the second capacitor busbar are located so as to be opposed to each other.

(Additional Note 4)

The power conversion device according to additional note 3, further comprising a spacer having insulating property and provided between the first flat-plate portion and the second flat-plate portion.

(Additional Note 5)

The power conversion device according to any one of additional notes 1 to 4, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion extends toward the one side in the second direction from a part of the flat-plate portion that is positioned on the one side in the second direction on one side or another side in the first direction, and
the DC path portion is located so as to overlap the capacitor sealing resin, as seen in a third direction perpendicular to the first direction and the second direction.

(Additional Note 6)

The power conversion device according to additional note 3 or 4, wherein
as seen in a third direction perpendicular to the first direction and the second direction,
an area of the first electrode that overlaps the element connection portions of the first capacitor busbar is smaller than an area of the first electrode that does not overlap the element connection portions of the first capacitor busbar, and
an area of the second electrode that overlaps the element connection portions of the second capacitor busbar is smaller than an area of the second electrode that does not overlap the element connection portions of the second capacitor busbar.

(Additional Note 7)

The power conversion device according to any one of additional notes 1 to 6, further comprising a ground-side capacitor element connected between the capacitor busbar and a ground, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion is located so as to at least partially overlap the ground-side capacitor element, as seen in a third direction perpendicular to the first direction and the second direction.

(Additional Note 8)

The power conversion device according to any one of additional notes 1 to 7, wherein
the power supply connection portion has a DC path portion which is a part exposed to outside from the capacitor sealing resin and connected to the flat-plate portion, and a DC connection portion which is a part connected to the DC path portion and connected to the DC power supply,
the power conversion device further comprises a ground-side capacitor element connected between the DC path portion and a ground and stored in the capacitor case with the capacitor sealing resin interposed,
the capacitor case is formed in a bottomed tubular shape, and
the ground-side capacitor element is located on an opened side opposite to a bottom wall side of the capacitor case.

(Additional Note 9)

The power conversion device according to any one of additional notes 1 to 8, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion has a support portion extending from the DC path portion into the capacitor sealing resin.

(Additional Note 10)

The power conversion device according to additional note 9, further comprising a ground-side capacitor element stored in the capacitor case with the capacitor sealing resin interposed, wherein the support portion is connected to one electrode of the ground-side capacitor element, and another electrode of the ground-side capacitor element is connected to a ground.

(Additional Note 11)

The power conversion device according to additional note 9 or 10, wherein the DC path portion has a plurality of the support portions.

(Additional Note 12)

The power conversion device according to any one of additional notes 9 to 11, wherein the support portion is located on the flat-plate portion side relative to the DC connection portion side at the DC path portion.

(Additional Note 13)

The power conversion device according to any one of additional notes 9 to 12, wherein the DC path portion is formed in a plate shape, and the DC connection portion and the support portion are provided at the same side surface of the DC path portion, as seen in a third direction perpendicular to the first direction and the second direction.

(Additional Note 14)

The power conversion device according to additional note 4, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion has a support portion extending from the DC path portion into the capacitor sealing resin, and
the spacer has an opposed portion held between the first flat-plate portion and the second flat-plate portion, and a spacer support portion extending in a direction of the DC path portion from the opposed portion and extending into the capacitor sealing resin along the support portion.

(Additional Note 15)

The power conversion device according to additional note 14, wherein
the spacer support portion has a tubular portion formed in a tubular shape surrounding a periphery of the support portion, and
the tubular portion extends into the capacitor sealing resin.

(Additional Note 16)
The power conversion device according to any one of additional notes 9 to 13, wherein
the support portion is formed in a plate shape, and
the support portion has, at a part extending into the capacitor sealing resin, one or both of a part cut out inward from a side surface and a part protruding toward the capacitor sealing resin side from a side surface.

(Additional Note 17)
The power conversion device according to any one of additional notes 1 to 16, further comprising a ground-side capacitor module including a ground-side capacitor element connected between the capacitor busbar and a ground, and a ground-side capacitor case storing the ground-side capacitor element with ground-side capacitor sealing resin interposed, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion is located so as to at least partially overlap the ground-side capacitor module, as seen in a third direction perpendicular to the first direction and the second direction.

(Additional Note 18)
The power conversion device according to any one of additional notes 1 to 17, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion is formed in a plate shape, and
a thickness of the DC path portion is greater than a thickness of the flat-plate portion.

(Additional Note 19)
The power conversion device according to additional note 17, further comprising a housing storing the power module unit, the capacitor module, and the ground-side capacitor module, wherein
the capacitor case and the ground-side capacitor case are each formed in a bottomed tubular shape,
the housing has a first surface to which the power module unit is thermally connected and a second surface to which the capacitor module and the ground-side capacitor module are thermally connected, and a coolant path for cooling the first surface is provided on a back side of the first surface,
the second surface faces toward one side in a third direction perpendicular to the first direction and the second direction and is located on the one side in the second direction of the first surface and on another side in the third direction relative to the first surface, and the housing has a step portion between the first surface and the second surface,
the coolant path is located on the other side in the second direction of the step portion, and
in one or both of the capacitor module and the ground-side capacitor module, an opened side opposite to a bottom wall side of each of the capacitor case and the ground-side capacitor case is opposed to the step portion.

(Additional Note 20)
The power conversion device according to additional note 19, wherein
the step portion, and one or both of the capacitor sealing resin and the capacitor busbar, are thermally connected to each other.

(Additional Note 21)
The power conversion device according to any one of additional notes 1 to 20, wherein
the element connection portion has a protrusion protruding toward the capacitor element, at an end on the capacitor element side, and
the capacitor element and the protrusion are connected to each other.

(Additional Note 22)
The power conversion device according to any one of additional notes 1 to 21, further comprising:
a housing storing the power module unit and the capacitor module; and
a control board for controlling the power module unit, wherein
the housing has a first surface to which the power module unit is thermally connected and a second surface to which the capacitor module is thermally connected,
the capacitor case is formed in a bottomed tubular shape that opens toward the other side in the second direction, a part of a peripheral wall thereof on the second surface side contacts with the second surface, and the capacitor case has a bush protruding toward an outer peripheral side, at a part of the peripheral wall on a side opposite to the second surface, and
the control board is fixed to the bush by a screw.

DESCRIPTION OF THE REFERENCE CHARACTERS 1 power conversion device
2 housing
2a first surface
2b second surface
2c step portion
21 coolant path
21a upstream-side path
21b downstream-side path
22 base portion
22a cooling fin
23 path forming portion
23a coolant inlet/outlet port
3 power module unit
31 power terminal
32a, 32b, 32c power body portion
33 output terminal
34 semiconductor element
4 capacitor module
41 capacitor element
42 capacitor busbar
42a positive busbar
42b negative busbar
420 spacer
420a opposed portion
420b spacer support portion
420b1 tubular portion
421 flat-plate portion
421a first flat-plate portion
421b second flat-plate portion
422 power supply connection portion
423 power terminal connection portion 424 DC path portion
425 element connection portion
4250 protrusion
426 DC connection portion
43 capacitor electrode
43a opening-side electrode
43b bottom-wall-side electrode
44 capacitor sealing resin
45 capacitor case
45a opening
45b bottom wall
45c lower wall portion
45d upper wall portion
46 GND busbar
46a fixation portion
47, 47a, 47b, 47c support portion
47d cutout
47e projection
48 bush
410 ground-side capacitor element
430 ground-side capacitor electrode
430a positive/negative electrode
430b GND electrode
40 ground-side capacitor module
440 ground-side capacitor sealing resin
450 ground-side capacitor case
450a opening
450b bottom wall
450c lower wall portion
450d upper wall portion
5 DC power supply
6 control board
7 heat dissipation member

What is claimed is:

1. A power conversion device comprising:
a power module unit including a plurality of semiconductor elements arranged in a first direction, a power body portion storing the plurality of semiconductor elements separately in a plurality of portions or collectively in one portion, and a plurality of power terminals respectively connected to the plurality of semiconductor elements and protruding from the power body portion toward one side in a second direction perpendicular to the first direction, the plurality of power terminals being arranged in the first direction; and
a capacitor module including a capacitor element, a capacitor case storing the capacitor element with capacitor sealing resin interposed, and a capacitor busbar connected to the capacitor element, wherein
the capacitor busbar has
a flat-plate portion formed in a plate shape of which a width in the first direction is greater than a width in the second direction, the flat-plate portion being exposed to outside from the capacitor sealing resin,
a plurality of power terminal connection portions extending toward another side in the second direction from the flat-plate portion and arranged in the first direction, the plurality of power terminal connection portions being respectively connected to the plurality of power terminals,
a power supply connection portion connected to the flat-plate portion and connected to a DC power supply, and
a plurality of element connection portions connected to the flat-plate portion and located on the one side in the second direction relative to the flat-plate portion, the plurality of element connection portions being arranged in the first direction and connected to the capacitor element,
an element-connection-portion position range which is a position range in the first direction between two element connection portions located at both ends in the first direction among the plurality of element connection portions, and a power-terminal-connection-portion position range which is a position range in the first direction between two power terminal connection portions located at both ends in the first direction among the plurality of power terminal connection portions, are within a position range in the first direction where the flat-plate portion is located,
a length of the element-connection-portion position range and a length of the power-terminal-connection-portion position range are equivalent to each other,
a center position of the element-connection-portion position range and a center position of the power-terminal-connection-portion position range are equivalent to each other, and
as seen in a direction where the element connection portions are arranged, along the second direction, the power terminal connection portions are arranged at an opposite side of the flat-plate portion than are the element connection portions.

2. The power conversion device according to claim 1, wherein
as seen in the second direction,
80% or more of the element-connection-portion position range overlaps the power-terminal-connection-portion position range, and
80% or more of the power-terminal-connection-portion position range overlaps the element-connection-portion position range.

3. The power conversion device according to claim 1, wherein
as the capacitor busbar, a first capacitor busbar connected to a first electrode of the capacitor element and a second capacitor busbar connected to a second electrode of the capacitor element are provided, and
a first flat-plate portion which is the flat-plate portion of the first capacitor busbar and a second flat-plate portion which is the flat-plate portion of the second capacitor busbar are located so as to be opposed to each other.

4. The power conversion device according to claim 3, further comprising a spacer having insulating property and provided between the first flat-plate portion and the second flat-plate portion.

5. The power conversion device according to claim 4, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion has a support portion extending from the DC path portion into the capacitor sealing resin, and
the spacer has an opposed portion held between the first flat-plate portion and the second flat-plate portion, and a spacer support portion extending in a direction of the DC path portion from the opposed portion and extending into the capacitor sealing resin along the support portion.

6. The power conversion device according to claim 5, wherein
the spacer support portion has a tubular portion formed in a tubular shape surrounding a periphery of the support portion, and
the tubular portion extends into the capacitor sealing resin.

7. The power conversion device according to claim 3, wherein
as seen in a third direction perpendicular to the first direction and the second direction,
an area of the first electrode that overlaps the element connection portions of the first capacitor busbar is smaller than an area of the first electrode that does not overlap the element connection portions of the first capacitor busbar, and
an area of the second electrode that overlaps the element connection portions of the second capacitor busbar is smaller than an area of the second electrode that does not overlap the element connection portions of the second capacitor busbar.

8. The power conversion device according to claim 1, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion extends toward the one side in the second direction from a part of the flat-plate portion that is positioned on the one side in the second direction on one side or another side in the first direction, and
the DC path portion is located so as to overlap the capacitor sealing resin, as seen in a third direction perpendicular to the first direction and the second direction.

9. The power conversion device according to claim 1, further comprising a ground-side capacitor element connected between the capacitor busbar and a ground, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion is located so as to at least partially overlap the ground-side capacitor element, as seen in a third direction perpendicular to the first direction and the second direction.

10. The power conversion device according to claim 1, wherein
the power supply connection portion has a DC path portion which is a part exposed to outside from the capacitor sealing resin and connected to the flat-plate portion, and a DC connection portion which is a part connected to the DC path portion and connected to the DC power supply,
the power conversion device further comprises a ground-side capacitor element connected between the DC path portion and a ground and stored in the capacitor case with the capacitor sealing resin interposed,
the capacitor case is formed in a bottomed tubular shape, and
the ground-side capacitor element is located on an opened side opposite to a bottom wall side of the capacitor case.

11. The power conversion device according to claim 1, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion has a support portion extending from the DC path portion into the capacitor sealing resin.

12. The power conversion device according to claim 11, further comprising a ground-side capacitor element stored in the capacitor case with the capacitor sealing resin interposed, wherein
the support portion is connected to one electrode of the ground-side capacitor element, and another electrode of the ground-side capacitor element is connected to a ground.

13. The power conversion device according to claim 11, wherein
the DC path portion has a plurality of the support portions.

14. The power conversion device according to claim 11, wherein
the support portion is located on the flat-plate portion side relative to the DC connection portion side at the DC path portion.

15. The power conversion device according to claim 11, wherein
the DC path portion is formed in a plate shape, and
the DC connection portion and the support portion are provided at the same side surface of the DC path portion, as seen in a third direction perpendicular to the first direction and the second direction.

16. The power conversion device according to claim 11, wherein
the support portion is formed in a plate shape, and
the support portion has, at a part extending into the capacitor sealing resin, one or both of a part cut out inward from a side surface and a part protruding toward the capacitor sealing resin side from a side surface.

17. The power conversion device according to claim 1, further comprising a ground-side capacitor module including a ground-side capacitor element connected between the capacitor busbar and a ground, and a ground-side capacitor case storing the ground-side capacitor element with ground-side capacitor sealing resin interposed, wherein
the power supply connection portion has a DC path portion which is a part exposed to outside from the capacitor sealing resin and connected to the flat-plate portion, and a DC connection portion which is a part connected to the DC path portion and connected to the DC power supply, and
the DC path portion is located so as to at least partially overlap the ground-side capacitor module, as seen in a third direction perpendicular to the first direction and the second direction.

18. The power conversion device according to claim 17, further comprising a housing storing the power module unit, the capacitor module, and the ground-side capacitor module, wherein
the capacitor case and the ground-side capacitor case are each formed in a bottomed tubular shape,
the housing has a first surface to which the power module unit is thermally connected and a second surface to which the capacitor module and the ground-side capacitor module are thermally connected, and a coolant path for cooling the first surface is provided on a back side of the first surface, the second surface faces toward one side in a third direction perpendicular to the first direction and the second direction and is located on the one side in the second direction of the first surface and on another side in the third direction relative to the first surface, and the housing has a step portion between the first surface and the second surface, the coolant path is located on the other side in the second direction of the step portion, and in one or both of the capacitor module and the ground-side capacitor module, an opened side opposite to a bottom wall side of each of the capacitor case and the ground-side capacitor case is opposed to the step portion.

19. The power conversion device according to claim 18, wherein
the step portion, and one or both of the capacitor sealing resin and the capacitor busbar, are thermally connected to each other.

20. The power conversion device according to claim 1, wherein
the power supply connection portion has a DC path portion which is a part exposed to outside from the capacitor sealing resin and connected to the flat-plate portion, and a DC connection portion which is a part connected to the DC path portion and connected to the DC power supply,
the DC path portion is formed in a plate shape, and
a thickness of the DC path portion is greater than a thickness of the flat-plate portion.

21. The power conversion device according to claim 1, wherein
the element connection portion has a protrusion protruding toward the capacitor element, at an end on the capacitor element side, and
the capacitor element and the protrusion are connected to each other.

22. The power conversion device according to claim 1, further comprising:
a housing storing the power module unit and the capacitor module; and
a control board for controlling the power module unit, wherein
the housing has a first surface to which the power module unit is thermally connected and a second surface to which the capacitor module is thermally connected,
the capacitor case is formed in a bottomed tubular shape that opens toward the other side in the second direction, a part of a peripheral wall thereof on the second surface side contacts with the second surface, and the capacitor case has a bush protruding toward an outer peripheral side, at a part of the peripheral wall on a side opposite to the second surface, and
the control board is fixed to the bush by a screw.

* * * * *